(12) United States Patent
Shimizu

(10) Patent No.: US 7,251,541 B2
(45) Date of Patent: Jul. 31, 2007

(54) SUBSTRATE-RELATED-OPERATION PERFORMING SYSTEM INCLUDING OPERATION-PERFORMING-PROGRAM JUDGING DEVICE, AND OPERATION-PERFORMING-PROGRAM JUDGING PROGRAM

(75) Inventor: Koji Shimizu, Nukata-gun (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 134 days.

(21) Appl. No.: 10/535,934

(22) PCT Filed: Nov. 20, 2003

(86) PCT No.: PCT/JP03/14855

§ 371 (c)(1),
(2), (4) Date: May 23, 2005

(87) PCT Pub. No.: WO2004/049775

PCT Pub. Date: Jun. 10, 2004

(65) Prior Publication Data

US 2006/0064192 A1    Mar. 23, 2006

(30) Foreign Application Priority Data

Nov. 22, 2002 (JP) ............................. 2002-338816

(51) Int. Cl.
*G06F 19/00* (2006.01)
*G06F 17/00* (2006.01)
*B23P 19/00* (2006.01)

(52) U.S. Cl. .................. 700/121; 700/90; 700/95; 29/739

(58) Field of Classification Search .................. 700/90, 700/95, 121; 29/739–740, 832
See application file for complete search history.

(56) References Cited

U.S. PATENT DOCUMENTS

| 5,822,449 A | * | 10/1998 | Kobayashi et al. ......... 382/141 |
| 6,317,972 B1 | * | 11/2001 | Asai et al. .................... 29/833 |
| 6,568,847 B2 | * | 5/2003 | Nishijima et al. ............ 374/45 |
| 6,757,966 B2 | * | 7/2004 | Inoue et al. .................. 29/840 |
| 6,920,369 B2 | * | 7/2005 | Ueno et al. ................. 700/121 |
| 2002/0014001 A1 | | 2/2002 | Isogai et al. |

FOREIGN PATENT DOCUMENTS

| JP | A 2001-308596 | 11/2001 |
| JP | A 2002-50894 | 2/2002 |
| JP | A 2002-50899 | 2/2002 |

* cited by examiner

*Primary Examiner*—Alexander Kosowski
(74) *Attorney, Agent, or Firm*—Oliff & Berridge, PLC

(57) ABSTRACT

A substrate-related-operation performing system improves its operation efficiency by preventing an error in replacing, for a substrate-related-operation performing apparatus thereof, an operation performing program with another operation performing program. A circuit-component mounting system includes a plurality of component mounting apparatuses are arranged in an array that perform cooperative operations to mount a plurality of circuit components on a substrate. One of the component mounting apparatuses implements a judging program, carrying out, in a judging mode, a judging operation when a mounting program is replaced with another mounting program, or when an operator inputs a command to carry out the judging operation. An operation-object code corresponding to a mounting program selected for a component mounting apparatus as a judgment-object operation performing apparatus is compared with a substrate code corresponding to the most downstream circuit substrate, whereby whether the mounting program is appropriate is judged.

20 Claims, 10 Drawing Sheets

SUBSTRATE-RELATED-OPERATION PERFORMING SYSTEM INCLUDING OPERATION-PERFORMING-PROGRAM JUDGING DEVICE, AND OPERATION-PERFORMING-PROGRAM JUDGING PROGRAM

TECHNICAL FIELD

The present invention relates to a substrate-related-operation performing system including a substrate-related-operation performing apparatus that performs an operation related to a circuit substrate, and particularly to such a system that judges whether an operation performing program corresponding to an operation performed by a substrate-related-operation performing apparatus is appropriate.

BACKGROUND ART

An electronic circuit is produced by mounting a circuit component such as an electronic component, on a circuit substrate such as a printed wiring board, and soldering the circuit component to the circuit substrate. A substrate-related-operation performing system performs at least a portion of the electronic-circuit producing process. A sub-strate-related operation performed by the substrate-related-operation performing system is, e.g., a solder-cream printing operation, a component mounting operation, or an adhesive applying operation. Thus, the substrate-related-operation performing system may employ various sorts of substrate-related-operation performing apparatuses that perform the above-indicated various sorts of operations. More specifically described, the substrate-related-operation performing system may employ a solder printing apparatus that applies, in advance, solder cream to portions of a circuit substrate where electronic components are to be mounted; a highly viscous fluid applying apparatus that applies an adhesive to fix electronic components to a circuit substrate, or the above-indicated solder cream; a component mounting apparatus that mounts electronic components at predetermined positions on a circuit substrate; or a re-flowing furnace that thermally treats solder cream provided between a circuit substrate and electronic components and thereby finishes soldering the components to the substrate. Generally, a desirable substrate-related-operation performing system is constituted by selecting, from the above-indicated various sorts of substrate-related-operation performing apparatuses, one or more necessary sorts and numbers of substrate-related-operation performing apparatuses, and combining the selected apparatuses such that the combined apparatuses are arranged along a line. For example, a substrate-related-operation performing system is constituted by a solder printing apparatus located in an upstream portion of the system, a plurality of component mounting apparatuses located on a downstream side of the solder printing apparatus, and a re-flowing furnace located on a downstream side of the component mounting apparatuses. In addition, a highly viscous fluid applying apparatus may be provided between the solder printing apparatus and the component mounting apparatuses.

Many substrate-related-operation performing apparatuses perform respective substrate-related operations according to respective operation performing programs. In those operation performing apparatuses, therefore, if a current sort of circuit substrates each as an operation object is changed to another sort of circuit substrates, then a current operation performing program needs to be replaced with another operation performing program. For example, a component mounting apparatus is such an operation performing apparatus that repeats a step of mounting a predetermined sort of electronic component at a predetermined position on a circuit substrate, and an operation performing program implemented by the component mounting apparatus describes contents of an operation to be performed, e.g., sorts of electronic components to be mounted on a circuit substrate, component-supply positions where those components are to be supplied, and component-mount positions where those components are to be mounted, and an order of mounting of those components. Likewise, an operation performing program implemented by a solder printing apparatus or a highly viscous fluid applying apparatus each as a substrate-related-operation performing apparatus other than the component mounting apparatus describes contents of an operation corresponding to a circuit substrate as an operation object. Since contents of an operation performed by a substrate-related-operation performing apparatus correspond to a sort of circuit substrates, the current operation performing program implemented by the substrate-related-operation performing apparatus needs to be replaced with a new operation performing program, when the current sort of circuit substrates as the operation objects are changed to a new sort of circuit substrates.

A single substrate-related-operation performing system can be operated for a plurality of sorts of circuit substrates each as an operation object. Generally, when a current sort of circuit substrates as operation objects are changed to another sort of circuit substrates, each substrate-related-operation performing apparatus is subjected to a re-setting procedure including replacing the current operation performing program with another operation performing program. Since the re-setting procedure includes various sorts of complicated operations, it is required, from the viewpoint of production efficiency, that those complicated operations be carried out reliably and quickly. Japanese Patent Application Publication No. 2001-308596 proposes, as a technique of carrying out efficiently the re-setting of substrate-related-operation performing system, to indicate guidelines to an operator who carries out the re-setting procedure.

DISCLOSURE OF THE INVENTION

However, even if an operator may be properly instructed, an error may occur. For example, when a re-setting procedure is carried out, the operator may select an incorrect operation performing program to replace a current operation performing program, or the operator may fail to replace the current operation performing program. In those cases, an erroneous operation performing program corresponding to a sort of circuit substrates other than a sort of circuit substrates as operation objects, is implemented. If in this way a substrate-related-operation performing apparatus performs an inappropriate operation, then defective products are produced, and an operation time consumed to perform the inappropriate operation is uselessly lost, so that an operation efficiency of a substrate-related-operation performing system is lowered.

It is therefore an object of the present invention to improve an operation efficiency of a substrate-related-operation performing system, by preventing an inappropriate operation from being performed according to an erroneous operation performing program. This object may be achieved according to any of the following modes of the present invention in the form of a substrate-related-operation performing system and a judging program, each of which is numbered like the appended claims and may depend from the other mode or modes, where appropriate, to indicate and clarify possible combinations of technical features. It is, however, to be understood that the present invention is not limited to the technical features or any combinations thereof that will be described below for illustrative purposes only. It is to be further understood that a plurality of features included in any one of the following modes of the invention are not necessarily provided altogether, and that the invention may be embodied without at least one of the features described with respect to each of the modes.

(1) A substrate-related-operation performing system comprising a plurality of substrate-related-operation performing apparatuses which are arranged along a line and which sequentially perform respective operations related to a circuit substrate, the system being characterized in that the substrate-related-operation performing apparatuses comprise a judgment-object operation performing apparatus, and the substrate-related-operation performing system further comprises a program judging device which judges whether an operation performing program which is implemented by the judgment-object operation performing apparatus is appropriate, and that the program judging device comprises a reference-information obtaining portion which obtains at least one batch of reference information which is related to at least one of the substrate-related-operation performing apparatuses and which is referred to in making a judgment about the operation performing program, and a judging portion which judges, based on the obtained batch of reference information, whether the operation performing program which is implemented by the judgment-object operation performing apparatus is appropriate.

The substrate-related-operation performing system in accordance with the present invention may employ various sorts of substrate-related-operation performing apparatuses such as a component mounting apparatus, a solder printing apparatus, an adhesive applying apparatus, or an inspecting apparatus that inspects results of an operation performed by a substrate-related-operation performing apparatus. The sort(s), and total number, of the substrate-related-operation performing apparatuses employed by the system are by no means limited, and accordingly various sorts of desirable systems may be obtained. For example, the substrate-related-operation performing system may consist of a single sort of substrate-related-operation performing apparatuses, e.g., a plurality of component mounting apparatuses, or a plurality of sorts of substrate-related-operation performing apparatuses, e.g., a solder printing apparatus, an adhesive applying apparatus, and a component mounting apparatus. Each of the above-indicated examples of the substrate-related-operation performing apparatuses performs an operation according to a specific, operation performing program corresponding to a specific sort of circuit substrates. That is, when a current sort of circuit substrates are changed to a different sort of circuit substrates, the each apparatus performs an operation according to a different operation performing program corresponding to the new sort of circuit substrates. However, the substrate-related-operation performing system in accordance with the present invention may employ, in addition to those substrate-related-operation performing apparatuses, at least one substrate-related-operation performing device, such as a substrate feeding device, that does not perform an operation according to a specific operation performing program corresponding to a specific sort of circuit substrates.

The substrate-related-operation performing system in accordance with the present invention is by no means limited to such a system that includes only a single substrate-related-operation performing apparatus as an object of judgment about whether an operation performing program implanted thereby is appropriate. More specifically explained, when a certain substrate-related-operation performing apparatus is judged about whether an operation performing program implanted thereby is appropriate, that substrate-related-operation performing apparatus is regarded as a judgment-object operation performing apparatus. Therefore, when two or more substrate-related-operation performing apparatuses of all the substrate-related-operation performing apparatuses are judged, those substrate-related-operation performing apparatus are regarded as judgment-object operation performing apparatuses; and when all the substrate-related-operation performing apparatuses are judged, all the substrate-related-operation performing apparatuses are regarded as judgment-object operation performing apparatuses. From the viewpoint of benefits of the program judgment, it is preferred that a substrate-related-operation performing apparatus that performs an operation according to a specific operation performing program corresponding to a specific sort of circuit substrates be selected as a judgment-object operation performing apparatus.

In the substrate-related-operation performing system in accordance with the present invention, the judgment about whether the operation performing program implemented by the judgment-object operation performing apparatus is made by the judging portion based on the reference information obtained by the reference-information obtaining portion. The reference information may include operation-performed-substrate-related information or program-related information. Since the operation-performed-substrate-related information and the program-related information will be described later, those are briefly described here. In short, the operation-performed-substrate-related information is information related to a circuit substrate to which an operation that is being performed by a substrate-related-operation performing apparatus is related; and the program-related information is information related to an operation performing program, e.g., information representing a sort of circuit substrates as objects of an operation performed according to the program.

The operation-performing-program judgment may be carried out such that based on at least one batch of reference information, a circuit substrate that will actually be an object of an operation performed by the judgment-object operation performing apparatus is recognized, and whether the thus recognized circuit substrate is an object of an operation performed according the operation performing program implemented by the judgment-object operation performing apparatus is judged. Otherwise, in the case where a plurality of substrate-related-operation performing apparatuses perform respective operations related to a circuit substrate, the program judgment may be carried out such that respective operation performing programs implemented by those substrate-related-operation performing apparatuses correspond to a same sort of circuit substrates. Regarding the latter case, it can be said that the respective operation performing programs are compared with each other to judge whether they agree with each other and thereby make an estimated judgment about whether the operation performing program implemented by the judgment-object operation performing apparatus is appropriate.

In the substrate-related-operation performing system in accordance with the present invention, the reference-information obtaining portion may not obtain respective batches of reference information that are related to all the substrate-related-operation performing apparatuses. That is, the reference-information obtaining portion may obtain at least one batch of reference information that is related to at least one of all the substrate-related-operation performing apparatuses, or respective batches of reference information that are related to all the substrate-related-operation performing apparatuses. More specifically explained, the reference-information obtaining portion may obtain a batch of reference information related to one substrate-related-operation performing apparatus located in an upstream portion of a production line along which the operation performing apparatuses are arranged, or respective batches of reference information that are related to a plurality of substrate-related-operation performing apparatuses located on an upstream side of the judgment-object operation performing apparatus.

In the substrate-related-operation performing system in accordance with the present invention, the program judging device may be provided anywhere in the system. That is, the program judging device may be provided in at least one of the substrate-related-operation performing apparatuses, or separately from the operation performing apparatuses. In the case where the program judging device is provided in one or more substrate-related-operation performing apparatuses, the program judging device may be provided in the substrate-related-operation performing apparatus as the judgment-object operation performing apparatus. In this case, the operation performing program implemented by the judgment-object operation performing apparatus is judged by the apparatus itself. Otherwise, the program judging device may be provided in a substrate-related-operation performing apparatus different than the substrate-related-operation performing apparatus as the judgment-object operation performing apparatus. In the latter case, the operation performing program implemented by the judgment-object operation performing apparatus is judged by the different apparatus. Meanwhile, in the case where the program judging device is provided separately from the substrate-related-operation performing apparatuses, the program judging device may be provided as a device independent of the operation performing apparatuses. Otherwise, in the case where the substrate-related-operation performing system employs a host computer that controls the substrate-related-operation performing apparatuses in an integrated manner, the program judging device may be provided in the host computer. In addition, the reference-information obtaining portion and the judging portion of the program judging device may not be provided in a single element, i.e., may be provided in a plurality of elements, respectively. The program judging device may include one or more reference-information obtaining portions and one or more judging portions. The program judging device may include a first number of reference-information obtaining portion or portions and a second number of judging portion or portions, such that the first and second numbers differs from each other. In the case where the program judging device includes a plurality of reference-information obtaining portions and/or a plurality of judging portions, the reference-information obtaining portions or the judging portions may be provided in a plurality of elements, respectively.

In the substrate-related-operation performing system in accordance with the present invention, reference information is information related to a substrate-related-operation performing apparatus, and may be obtained from the substrate-related-operation performing apparatus itself, or from, e.g., a host computer if it is employed. In the case where reference information is obtained from a substrate-related-operation performing apparatus, the information may be information that has been obtained by the operation performing apparatus itself, or information that has been supplied to, and stored by, the operation performing apparatus. The information obtained by the operation performing apparatus itself may be operation-performed-substrate-related information, described later, that is obtained by a substrate-related-information recognizing device employed by the operation performing apparatus. Meanwhile, the information supplied to the operation performing apparatus may be program-related information, described later, that is related to an operation performing program implemented by the apparatus itself.

In the substrate-related-operation performing system in accordance with the present invention, the operation-performing-program judgment may be carried out at any time as a general rule. For example, the program judgment may be carried out at an arbitrary time, e.g., when a current operation performing program is replaced with another operation performing program for the judgment-object operation performing apparatus, when a re-setting operation is ended on the judgment-object operation performing apparatus, when a command to start the judgment is inputted, before the next circuit substrate is carried into the judgment-object operation performing apparatus, or when a substrate-related-operation performing apparatus located on an upstream side of the judgment-object operation performing apparatus has started carrying in a circuit substrate as the next operation object. Though some modes of the substrate-related-operation performing system in accordance with the present invention are explained in detail, below, the program judgment may be carried out at any appropriate time that is selected for each of the modes in view of the advantages of the each mode.

(2) The substrate-related-operation performing system according to the mode (1), wherein the operation performing program comprises a next operation performing program corresponding to a next circuit substrate to which a next operation to be next performed by the judgment-object operation performing apparatus is related, wherein the judgment-object operation performing apparatus is to implement the next operation performing program and thereby perform the next operation related to the next circuit substrate, and wherein the judging portion judges whether the next operation performing program to be implemented by the judgment-object operation performing apparatus is appropriate.

In the substrate-related-operation performing system in accordance with the present invention, the judging portion may judge not only the next operation performing program but also the second next operation performing program or the third next operation performing program. In the present mode, the judging portion judges whether the next operation performing program is appropriate. Thus, the present mode is easy and serviceable. In the case where a re-setting procedure or operation includes replacing a current operation performing program with a new operation performing program corresponding to a new sort of circuit substrates, the new operation performing program may be regarded as the next operation performing program. Otherwise, in the case where a re-setting operation does not include replacing a current operation performing program with another operation performing program, i.e., maintaining the current operation performing program corresponding to a current sort of circuit substrates, the current operation performing program may be regarded as the next operation performing program. Thus, the substrate-related-operation performing system in accordance with the present invention can judge whether the operation performing program is appropriate, not only when a re-setting operation is carried out, but also when the operation performing system is being continuously operated.

(3) The substrate-related-operation performing system according to the mode (2), wherein the reference-information obtaining portion obtains said at least one batch of reference information comprising at least one batch of operation-performed-substrate-related information which is related to at least one circuit substrate to which at least one operation which is being performed by said at least one substrate-related-operation performing apparatus is related, and wherein the judging portion comprises a next-circuit-substrate recognizing portion which recognizes, based on said at least one batch of operation-performed-substrate-related information, said at least one circuit substrate as the next circuit substrate; and a next-circuit-substrate-dependent judging portion which judges whether the next operation performing program to be implemented by the judgment-object operation performing apparatus is appropriate for the next circuit substrate recognized by the next-circuit-substrate recognizing portion.

In the substrate-related-operation performing system in accordance with the present mode, the reference information including the operation-performed-substrate-related information is obtained and, based on the operation-performed-substrate-related information, the next circuit substrate is recognized. The operation performing program is judged based on the recognized next circuit substrate. Since one of the circuit substrates, present in the system, that is to be next carried into the judgment-object operation performing apparatus is recognized as the next circuit substrate, whether the next operation performing program to be next implemented by the judgment-object apparatus is appropriate can be judged by judging whether the circuit substrates corresponding to the next program are of the same sort as that of the next circuit substrate. Thus, the substrate-related-operation performing system can improve its operation efficiency. The operation-performed-substrate-related information may be information representing a sort of a circuit substrate or an ID of a circuit substrate. An ID of a circuit substrate may be a number allotted to each individual circuit substrate. Thus, an ID of a circuit substrate may not represent a sort of the substrate. However, in the case where a relationship between respective IDs of individual circuit substrates and respective sorts of those substrates is stored, the sort of each substrate can be identified based on the ID of the each substrate and, based on the identified sort of the substrate, the operation performing program can be judged. As far as the present specification is concerned, a state in which a substrate-related-operation performing apparatus is performing an operation related to a circuit substrate should be construed to encompass not only a state in which the apparatus is actually performing the operation, but also a state in which the circuit substrate is entering the apparatus before the operation is started, or a state in which the circuit substrate is quitting the apparatus after the operation has been ended.

(4) The substrate-related-operation performing system according to the mode (3), wherein the next-circuit-substrate recognizing portion recognizes the next circuit substrate, based on said at least one batch of operation-performed-substrate-related information corresponding to at least one of the substrate-related-operation performing apparatuses that is located on an upstream side of the judgment-object operation performing apparatus.

The substrate-related-operation performing apparatuses sequentially perform the respective operations as the circuit substrate is fed from the upstream apparatuses toward the downstream apparatuses. Therefore, the next circuit substrate can be easily recognized by referring to the operation-performed-substrate-related information that is related to the circuit substrate present on the upstream side of the judgment-object operation performing apparatus. According to the present mode, the most downstream circuit substrate of the circuit substrates present on the upstream side of the judgment-object operation performing apparatus may be recognized as the next circuit substrate, or the circuit substrate to which the operation that is being performed by the substrate-related-operation performing apparatus located on the upstream side of, and adjacent to, the judgment-object operation performing apparatus is related may be recognized as the next circuit substrate.

(5) The substrate-related-operation performing system according to the mode (3), wherein the next-circuit-substrate recognizing portion recognizes the next circuit substrate, based on said at least one batch of operation-performed-substrate-related information corresponding to the judgment-object operation performing apparatus.

According to the present mode, the circuit substrate that has been carried into the judgment-object operation performing apparatus may be recognized as the next circuit substrate, and the next operation performing program may be judged based on the thus recognized next circuit substrate. Since the circuit substrate that has actually been carried into the judgment-object operation performing apparatus is recognized as the next circuit substrate, whether the next operation performing program is appropriate can be judged with reliability. Usually, a circuit substrate is carried into a substrate-related-operation performing apparatus by a substrate feeding device of the operation performing apparatus and, in order that the substrate feeding device may carry in the circuit substrate, the substrate-related-operation performing apparatus needs to specify the sort of the circuit substrate before the substrate enters the apparatus. In contrast, in the case where information related to a circuit substrate that has been carried into a substrate-related-operation performing apparatus is obtained by the apparatus itself, the apparatus needs to employ a means for allowing the circuit substrate to be carried in before the sort of the substrate is specified, and thereby obtain information related to the thus carried-in substrate.

(6) The substrate-related-operation performing system according to any of the modes (3) through (5), wherein said at least one circuit substrate to which said at least one operation which is being performed by said at least one substrate-related-operation performing apparatus is related has an information indicator which is affixed to said at least one circuit substrate and indicates information related to said at least one circuit substrate, wherein said at least one substrate-related-operation performing apparatus includes an operation-performed-substrate-related-information recognizing device which recognizes, from the information indicator of said at least one circuit substrate, said at least one batch of operation-performed-substrate-related information related to said at least one circuit substrate, and wherein the reference-information obtaining portion obtains said at least one batch of operation-performed-substrate-related information recognized by the operation-performed-substrate-related-information recognizing device.

The information indicator is not limited to any specific indicators, and is, for example, a visually recognizable thing such as a 2D (two-dimensional) code (e.g., a QR code or a data matrix), a bar code, symbols, digits, or alphabetic letters. The information indicator may be affixed to the circuit substrate, in such a manner that a label on which the indicator is printed is adhered to the substrate, or the indicator is printed on a surface of the substrate. In addition, a portion of a wiring pattern of the circuit substrate may be utilized as the information indicator. In this case, operation-performed-substrate-related information may be obtained by recognizing that portion of the wiring pattern. The substrate-related-information recognizing device may be employed by each of all the substrate-related-operation performing apparatuses of the system, or one or more substrate-related-operation performing apparatuses as a portion of all the apparatuses. Otherwise, the present system may employ a substrate-related-operation performing apparatus that is mainly constituted by the substrate-related-information recognizing device, i.e., has, as a main function thereof, the function of recognizing the operation-performed-substrate-related information.

(7) The substrate-related-operation performing system according to any of the modes (1) through (6), wherein the reference-information obtaining portion obtains a plurality of said batches of reference information comprising a plurality of batches of program-related information, respectively, which are related to respective operation performing programs which are implemented by the substrate-related-operation performing apparatuses, and wherein the judging portion comprises a program-related-information-dependent judging portion which judges, based on at least one of the batches of program-related information that corresponds to at least one of the substrate-related-operation performing apparatuses that differs from the judgment-object operation performing apparatus, whether the operation performing program which is implemented by the judgment-object operation performing apparatus is appropriate.

Whether the operation performing program is appropriate may be judged by judging whether a sort of a circuit substrate as an object of the program is appropriate. In other words, a plurality of operation performing programs may be compared with each other by comparing respective sorts of respective circuit substrates as respective objects of those programs, with each other. Program-related information may be individual information of each operation performing program, such as a name, a code, or an ID (identification) of the each program, or alternatively may be information representing a sort of circuit substrates as objects of the each program. For example, in the case where the program-related information is the individual information of each operation performing program and the individual information contains the information representing the sort of circuit substrates as the objects of the each program, the above-indicated judgment can be made. Even though the individual information may not contain the information representing the sort of circuit substrates as the objects of the each program, the above-indicated judgment can be made based on a relationship between each of operation performing programs and a sort of circuit substrates as objects of the each program, if the relationship is stored.

(8) The substrate-related-operation performing system according to the mode (7), wherein the program-related-information-dependent judging portion judges, based on the batch of program-related information corresponding to one of the substrate-related-operation performing apparatuses that is located on an upstream side of, and adjacent to, the judgment-object operation performing apparatus, whether the operation performing program which is implemented by the judgment-object operation performing apparatus is appropriate.

In the substrate-related-operation performing system, the circuit substrate is fed from the upstream-side substrate-related-operation performing apparatuses toward the downstream-side substrate-related-operation performing apparatuses. Therefore, generally, the replacement of operation performing programs is carried out in a direction from the upstream apparatuses toward the downstream apparatuses. In view of this, the operation performing program can be easily judged by utilizing the program-related information obtained from the substrate-related-operation performing apparatus located on the upstream side of, and adjacent to, the judgment-object operation performing apparatus.

(9) The substrate-related-operation performing system according to the mode (7), wherein the program-related-information-dependent judging portion judges, based on the batch of program-related information corresponding to one of the substrate-related-operation performing apparatuses that is performing the operation related to a most downstream one of the circuit substrates located on an upstream side of the judgment-object operation performing apparatus, whether the operation performing program which is implemented by the judgment-object operation performing apparatus is appropriate.

The next circuit substrate for which the judgment-object operation performing apparatus will perform the next operation is the most downstream one of the circuit substrates located on the upstream side of the judgment-object operation performing apparatus. Therefore, the operation performing program can be easily judged based on the program-related information obtained from the substrate-related-operation performing apparatus that is performing the operation related to the most downstream circuit substrate.

(10) The substrate-related-operation performing system according to any of the modes (7) through (9), wherein at least two substrate-related-operation performing apparatuses of the plurality of substrate-related-operation performing apparatuses constitute a concurrent-change group in which the respective operation performing programs implemented by said at least two substrate-related-operation performing apparatuses are concurrently changed with respective new operation performing programs, and the judgment-object operation performing apparatus belongs to the concurrent-change group, and wherein the program-related-information-dependent judging portion judges, based on at least one of the batches of program-related information that corresponds to at least one of said at least two substrate-related-operation performing apparatuses of the concurrent-change group that differs from the judgment-object operation performing apparatus, whether the operation performing program which is implemented by the judgment-object operation performing apparatus is appropriate.

The substrate-related-operation performing apparatuses may be re-set in an individual re-setting mode in which the apparatuses are re-set one by one, or in a group re-setting mode in which a group of apparatuses are concurrently re-set. The present mode corresponds to the group re-setting mode. Two or more substrate-related-operation performing apparatuses for which the replacement of operation performing programs is concurrently carried out constitute the concurrent-change group. In this case, after the replacement of operation performing programs is concurrently carried out, the respective new operation performing programs for all the apparatuses belonging to the concurrent-change group should correspond to a same sort of circuit substrates. In the present mode, this is utilized for judging whether the operation performing program is appropriate. For this judgment, the program-related information may be obtained from any one, more, or all of the substrate-related-operation performing apparatuses of the concurrent-change group except for the judgment-object operation performing apparatus. In a state in which none of the substrate-related-operation performing apparatuses of the concurrent-change group has started the operation, which operation performing program is inappropriate may not be judged even if either one of the operation performing program implemented by the judgment-object operation performing apparatus and the operation performing program implemented by the referenced substrate-related-operation performing apparatus may be inappropriate. In this case, the judging device may judge that the two operation performing programs do not agree with each other, so that an operator can deal with this judgment so as to prevent the inappropriate program from being implemented. Since this judgment is advantageous, the program judging device of the present system may judge that the operation performing program implemented by the judgment-object operation performing apparatus and the operation performing program implemented by the referenced substrate-related-operation performing apparatus do not agree with each other.

(11) The substrate-related-operation performing system according to any of the modes (1) through (10), wherein at least one of the substrate-related-operation performing apparatuses comprises at least the judging portion of the program judging device.

For example, the judging portion may be provided in one substrate-related-operation performing apparatus as the judgment-object operation performing apparatus. In this case, the judgment-object apparatus judges whether the operation performing program implemented thereby is appropriate. In addition, the judging portion may be provided in each of a plurality of substrate-related-operation performing apparatuses each as the judgment-object operation performing apparatus. Alternatively, the judging portion may be provided in one of the substrate-related-operation performing apparatuses, irrespective of whether the one substrate-related-operation performing apparatus may be the judgment-object operation performing apparatus, so that the judging portion may judge whether the operation performing program implemented by each of the other apparatuses than the one apparatus is appropriate. In the latter case, the substrate-related-operation performing apparatus other than the judgment-object operation performing apparatus judges whether the operation performing program implemented by the judgment-object apparatus is appropriate.

(12) The substrate-related-operation performing system according to any of the modes (1) through (10), wherein the program judging device is separate from each of the substrate-related-operation performing apparatuses.

As described above, the substrate-related-operation performing system may further comprise a host computer that can communicate information with each of the substrate-related-operation performing apparatuses. In this case, the program judging device may be provided in the host computer, according to the present mode. Alternatively, according to the present mode, the program judging device may be provided as an exclusive judging device that is independent of each of the substrate-related-operation performing apparatuses and the host computer and has an exclusive function of judging whether the program performing program is appropriate.

(13) The substrate-related-operation performing system according to any of the modes (1) through (12), wherein the judgment-object operation performing apparatus comprises a program storage portion in which the operation performing program is stored upon operation of an input device by an operator, and wherein the program judging device judges whether the stored operation performing program is appropriate.

The replacement of operation performing programs may be carried out upon operation of an input device by the operator. For example, the operator may operate an input device of the judgment-object operation performing apparatus to carry out the replacement of operation performing programs; the operator may operate an input device of the above-described host computer to command the judgment-object operation performing apparatus to carry out the replacement of operation performing programs; or the operator may operate an input device to store a predetermined schedule, so that the judgment-object apparatus carries out the replacement of operation performing programs according to the stored schedule. Since the operator is a human being, he or she may erroneously operate the input device. The present mode is for judging whether the operation performing program changed by the operator's operation of the input device is appropriate. Thus, the present mode is practical.

(14) A judging program which is implemented by a computer to judge, in a substrate-related-operation performing system comprising a plurality of substrate-related-operation performing apparatuses which are arranged along a line and which sequentially perform respective operations related to a circuit substrate, whether an operation performing program which is implemented by a judgment-object operation performing apparatus as one of the substrate-related-operation performing apparatuses is appropriate, the judging program being characterized by comprising a reference-information obtaining step of obtaining at least one batch of reference information which is related to at least one of the substrate-related-operation performing apparatuses and which is referred to in making a judgment about the operation performing program, and a judging step of judging, based on the obtained batch of reference information, whether the operation performing program which is implemented by the judgment-object operation performing apparatus is appropriate.

(15) The judging program according to the mode (14), wherein the reference-information obtaining step comprises an operation-performed-substrate-related information obtaining step of obtaining, as said at least one batch of reference information, at least one batch of operation-performed-substrate-related information which is related to at least one circuit substrate to which at least one operation which is being performed by said at least one substrate-related-operation performing apparatus is related, and wherein the judging step is for judging whether a next operation performing program corresponding to a next circuit substrate to which a next operation to be next performed by said at least one judgment-object operation performing apparatus is related is appropriate, and comprises a next-circuit-substrate recognizing step of recognizing, based on said at least one batch of operation-performed-substrate-related information, said at least one circuit substrate as the next circuit substrate; and a next-circuit-substrate-dependent judging step of judging whether the next operation performing program to be implemented by the judgment-object operation performing apparatus is appropriate for the next circuit substrate recognized by the next-circuit-substrate recognizing portion.

(16) The judging program according to the mode (14) or (15), wherein the reference-information obtaining step comprises a program-related-information obtaining step of obtaining, as a plurality of said batches of reference information, a plurality of batches of program-related information which are related to respective operation performing programs which are implemented by the substrate-related-operation performing apparatuses, and wherein the judging step comprises a program-related-information-dependent judging step of judging, based on at least one of the batches of program-related information that corresponds to at least one of the substrate-related-operation performing apparatuses that differs from the judgment-object operation performing apparatus, whether the operation performing program which is implemented by the judgment-object operation performing apparatus is appropriate.

The above-indicated three modes (14), (15), and (16) are related to a computer program for judging whether the operation performing program implemented by the judgment-object operation performing apparatus is appropriate, and correspond to the above-described three modes (1), (3), and (7), respectively, that are related to the substrate-related-operation performing system. Since the respective functions and advantages of each of the modes (14), (15), and (16) are the same as those of a corresponding one of the modes (1), (3), and (7), the description thereof is omitted here. Therefore, the technical features in accordance with the above-described modes (2) through (13) that are related to the substrate-related-operation performing system may be combined with each of the modes (14) through (16), in the same manner as the manner in which the modes (2) through (16) are combined with each of the modes (1), (3), and (7).

BEST MODE FOR CARRYING OUT THE INVENTION

Hereinafter, there will be described in detail an embodiment of the present invention in the form of a circuit-component mounting system that performs a component mounting operation (as a sort of substrate-related operation) in which the system mounts, on a circuit substrate, circuit components constituting an electronic circuit. It is, however, to be understood that the present invention is by no means limited to the details of the following embodiments but may be embodied with various changes and improvements, such as those described in DISCLOSURE OF THE INVENTION, that may occur to a person skilled in the art.

<Construction of Circuit-Component Mounting System>

Figure 1:
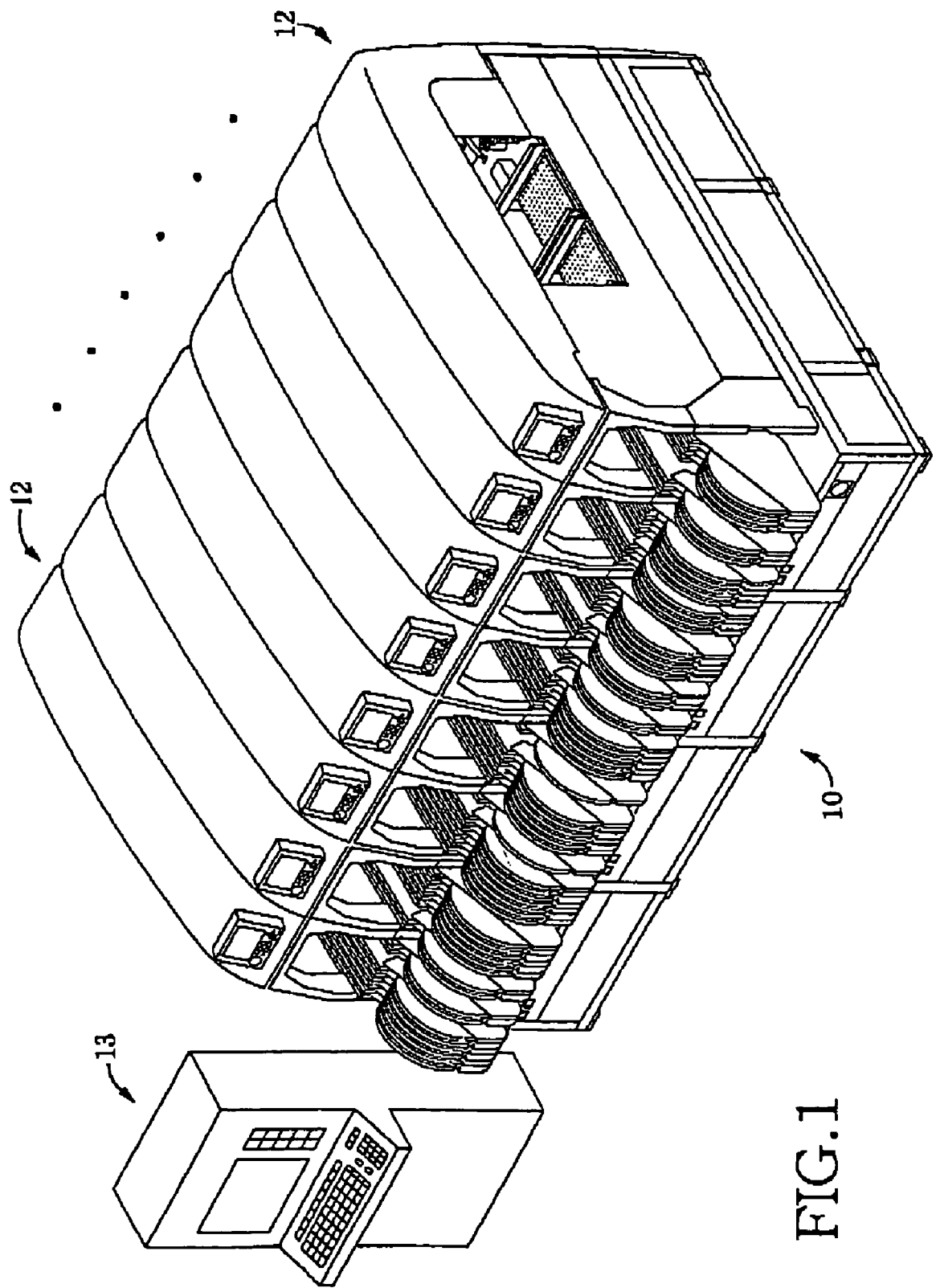
FIG. 1 is a perspective view of a general arrangement of a circuit-component mounting system as an embodiment of the present invention.

As shown in FIG. 1, the present circuit-component mounting system includes a base 10 as a basic portion of the system as a whole; a plurality of (eight) component mounting apparatuses 12 (each as a sort of substrate-related-operation performing apparatus) that are provided on the base 10 such that the component mounting apparatuses 12 are located adjacent each other and are arranged in an array; and a system control device 13 (also called a host computer) that is separate from the base 10 and the component mounting apparatuses 12 and controls the system in an integrated manner. The component mounting apparatuses 12 have a substantially identical hardware construction, and are arranged in a direction in which each circuit substrate is fed. In the following description of the present system, the direction in which the component mounting apparatuses 12 are arranged will be referred to as the "left-and-right" direction; and a direction perpendicular to the left-and-right direction will be referred to as the "front-and-rear" direction. Thus, a left and front portion of the figure will be referred to as the "front" side of the present system. In addition, a left side of the present system will be referred to as the "upstream" side thereof; and a right side of the system will be referred to as the "downstream" side thereof. Thus, while each circuit substrate is fed from the component mounting apparatuses 12 located in the left-side portion of the system, toward the apparatuses 12 located in the right-side portion of the system, the apparatuses 12 sequentially perform respective component mounting operations. The eight component mounting apparatuses 12 are given respective sequential numbers, No. 1 through No. 8, in a direction from the most upstream apparatus 12 toward the most downstream apparatus 12.

Figure 2:
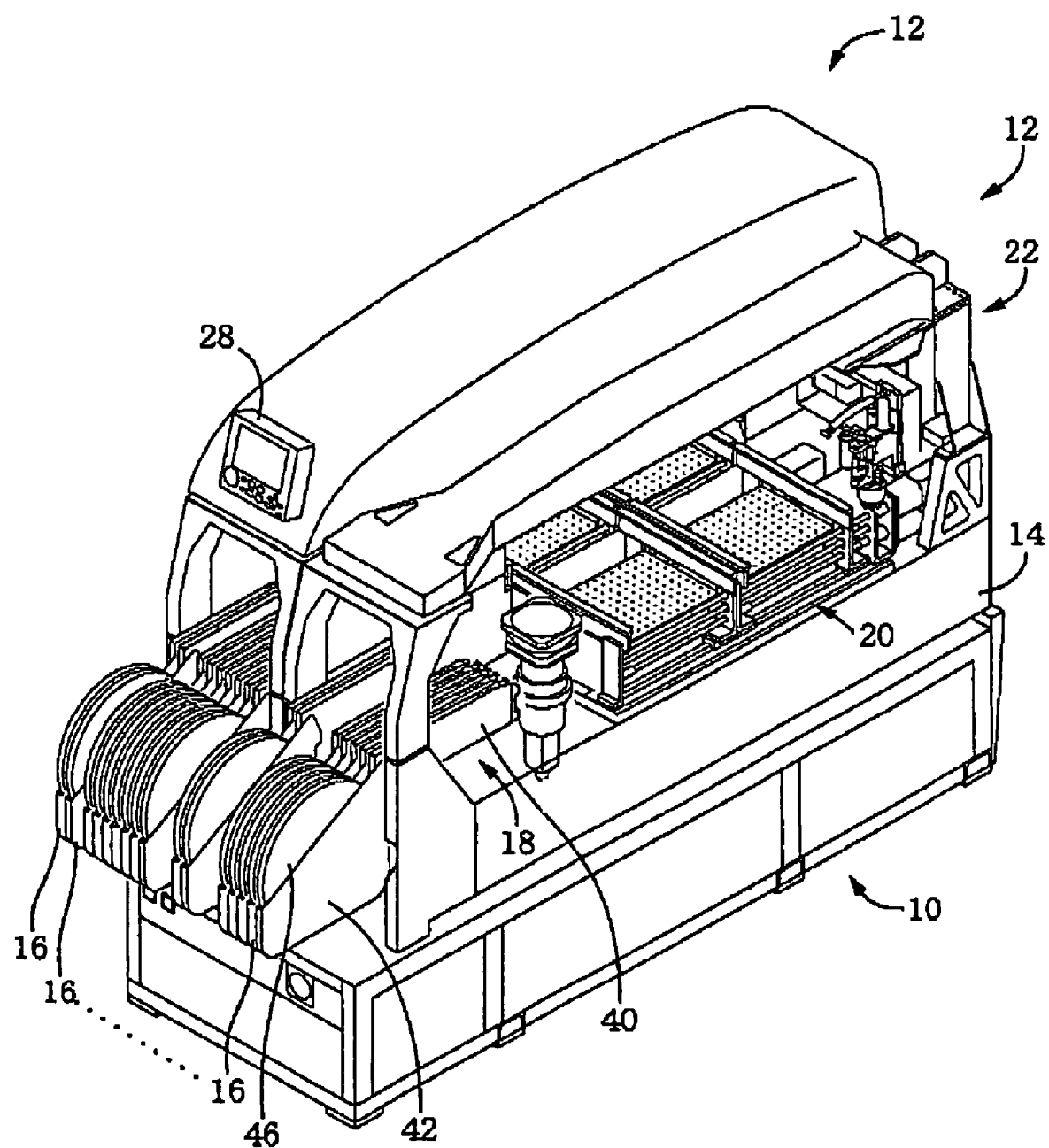
FIG. 2 is a perspective view of an internal construction of a component mounting apparatus constituting a portion of the circuit-component mounting system.

FIG. 2 is an enlarged view of two component mounting apparatuses 12 out of the eight component mounting apparatuses 12, and shows the right component mounting apparatus 12 in a state in which a cover member is removed. As shown in the figure, each component mounting apparatus 12 includes a main body 14; and various functional portions supported by the main body 14, that is, a component supplying portion 18 including a plurality of tape feeders (hereinafter, referred to as the "feeders") 16 each of which functions as a component supplying device that supplies electronic-circuit components (each as a sort of circuit component); a substrate holding portion 20 that has a function of feeding a circuit substrate and additionally functions as a substrate fixing portion that can fix the circuit substrate in an operation performing area; and a component taking and mounting portion 22 that takes electronic-circuit components (hereinafter, referred to as the components) supplied by the feeders 16, and mounts the components on the circuit substrate fixed by the substrate holding portion 20. Moreover, each component mounting apparatus 12 includes a mounting-apparatus control device 26 (see FIG. 5), and operates while the mounting-apparatus control device 26 controls the above-indicated functional portions of the apparatus 12. In addition, each component mounting apparatus 12 includes an operation and display panel 28 as an input and output device that is provided in a top portion thereof and is connected to the mounting-apparatus control device 26. The operation and display panel 28 receives various commands, information, etc. that are inputted by an operator, and displays information, etc that represents a status of the component mounting apparatus 12, etc.

Each one of the feeders 16 of the component holding portion 18 essentially includes a tape feeding portion 40 and a reel holding portion 42. The reel holding portion 42 holds a reel 46 around which an electronic-component tape as electronic components (each as a sort of circuit component) supported by a base tape and a cover tape is wound. Though not described in detail, the tape feeding portion 40 includes a drive source provided therein, and feeds, from the reel 46, the electronic-component tape at a tape feeding pitch equal to a component holding pitch at which the tape holds the electronic components, such that the feeding of the tape corresponds to the mounting operation. As the electronic-component tape is fed, the cover tape is peeled off the base tape, and the electronic components are supplied, one by one, from a predetermined component-supply position on the each feeder 16.

Figure 3:
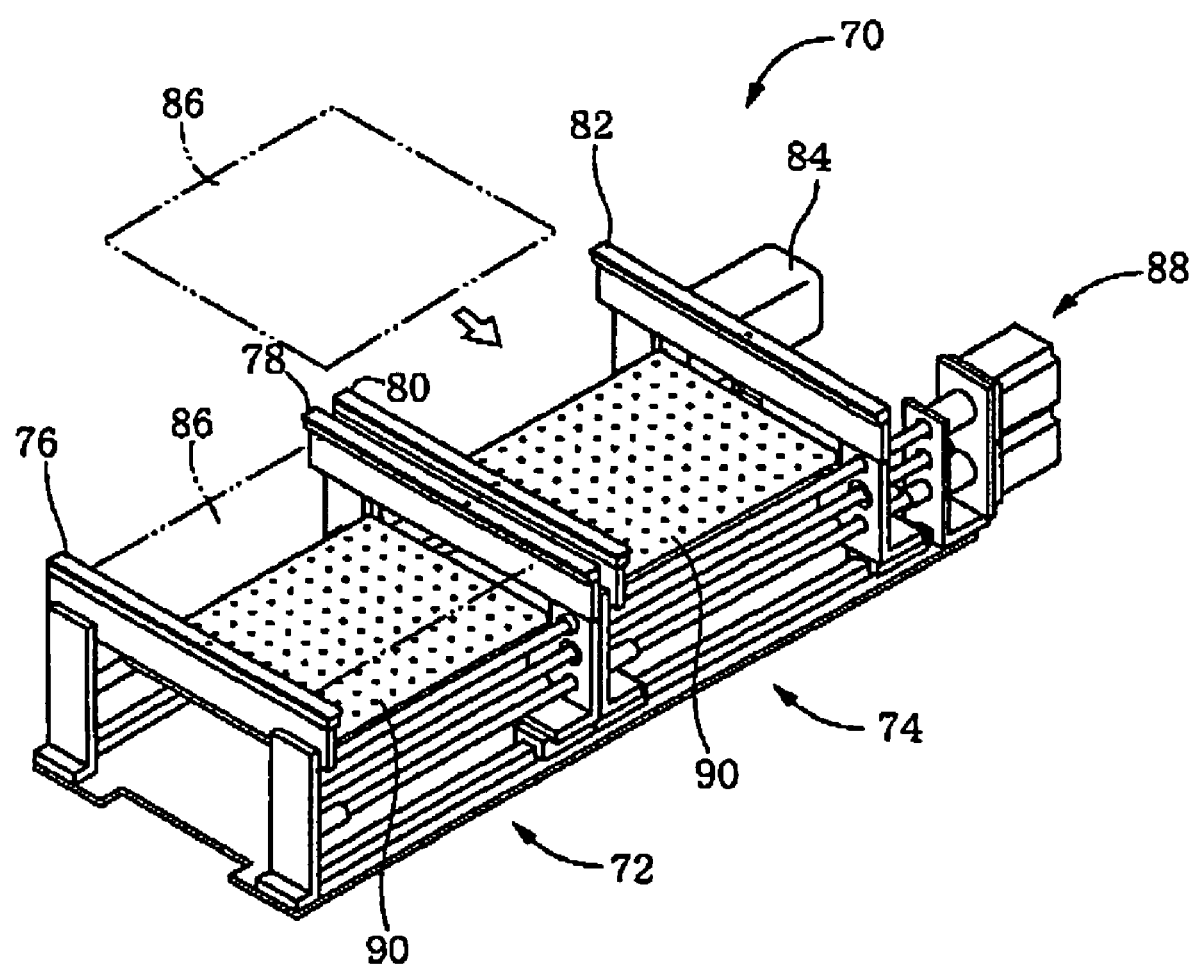
FIG. 3 is a perspective view of a substrate feeding unit employed by the component mounting apparatus.

The substrate holding portion 20 is essentially constituted by a substrate feeding unit 70 shown in FIG. 3. Though not described in detail, the substrate feeding unit 70 is essentially constituted by two conveyor devices, i.e., a front conveyor 72 and a rear conveyor 74. The front conveyor 72 includes two conveyor rails 76, 78 that are opposed to each other; and the rear conveyor 74 includes two conveyor rails 80, 82 that are opposed to each other. Conveyor belts, not shown, are circulated under the conveyor rails 76, 78, 80, 82, respectively, by a conveyor motor 84. A circuit substrate 86 is fed while being supported by each pair of conveyor belts. The component mounting apparatuses 12 of the present system employ the respective substrate feeding units 70, such that those units 70 are arranged along a straight line. The respective substrate feeding units 70 of the component mounting apparatuses 12 can cooperate with each other to feed the circuit substrate 86. Thus, the substrate feeding units 70 cooperate with each other to constitute a substrate feeding device of the present system. Each of the conveyor rails 78, 80, 82 other than the conveyor belt 76 can be moved in the front-and-rear direction, by a conveyor-width adjusting motor 88, so as to adjust freely a width of each conveyor 72, 74. If only one of the front and rear conveyors 72, 74 is used, a circuit substrate having a great width can be fed by the one conveyor.

When the conveyor motor 84 is operated or driven, the circuit substrate 86 is fed into the operation performing area, and is stopped at a predetermined stop position. Each substrate feeding unit 70 has, in a lower portion thereof, two circuit-substrate support plates 90 that can be moved upward and downward by respective elevating and lowering devices, not shown. On each of the support plates 90, there are provided a plurality of support pins, not shown, such that each of the support pins can be moved to an arbitrary position. When each support plate 90 is moved upward, the circuit substrate 86 is moved upward while being supported by the support pins, so that the circuit substrate 86 is lifted off the conveyor belts and is sandwiched by respective portions of the conveyor rails 76, 78 or the conveyor rails 80, 82, and the support pins 90. Thus, the circuit substrate 86 is fixed at the predetermined stop position. The circuit substrate 86 can be released by lowering the support plate 90. Thus, the substrate feeding unit 70 of each component mounting apparatus 12 functions as the substrate fixing portion of the apparatus 12.

Figure 4:
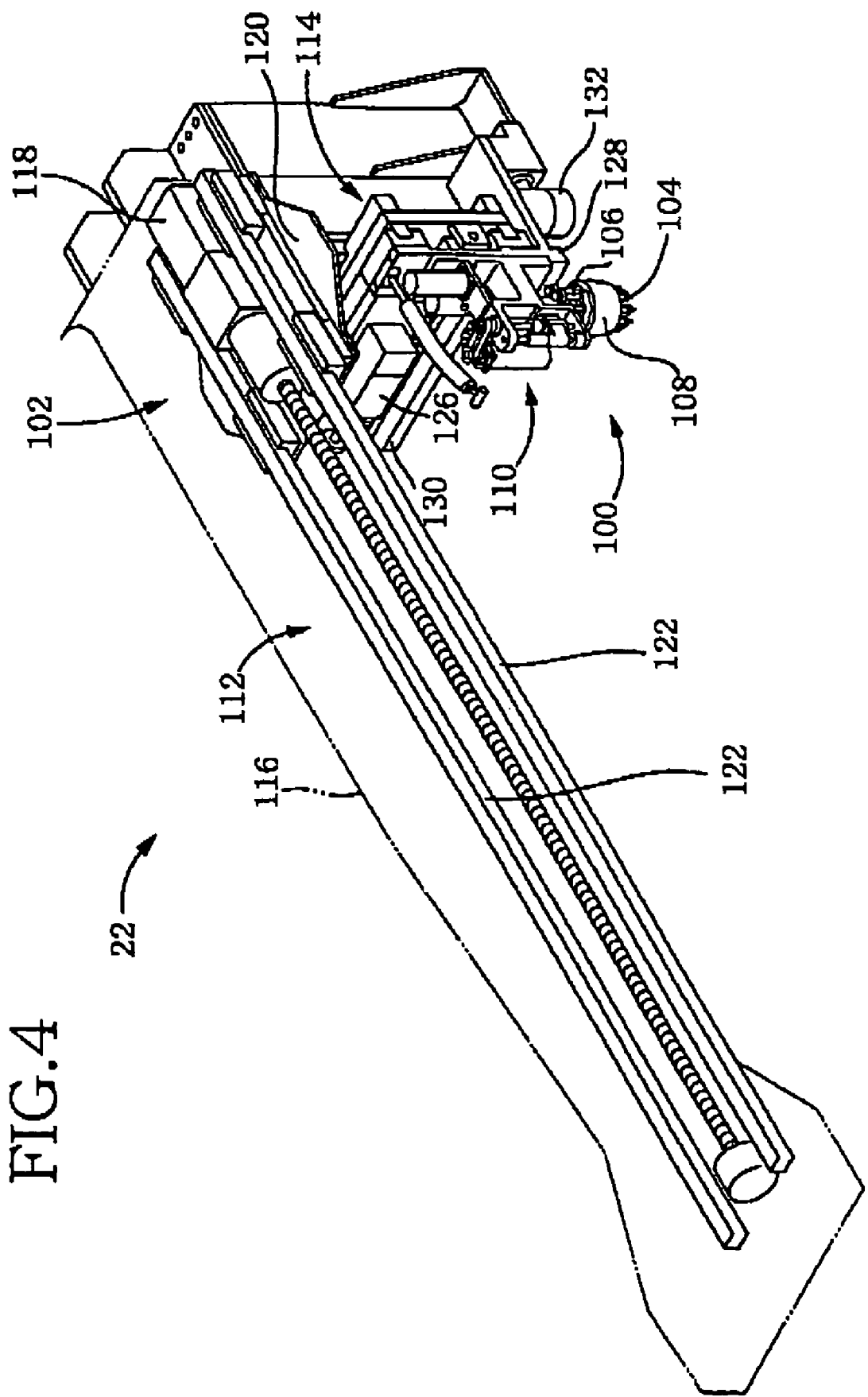
FIG. 4 is a perspective view of a component taking and mounting portion of the component mounting apparatus.

As shown in FIG. 4, the component taking and mounting portion 22 includes a mounting head 100 and a mounting-head moving device 102. Though not described in detail, the mounting head 100 includes a plurality of (eight) mounting units 106 each having a bar-like shape. Each of the mounting units 106 has, in a lower end portion thereof, a suction nozzle 104 as a component holding device. The mounting units 106 are held by a unit holding body 108 such that the units 106 are equiangularly spaced from each other on a common circle and such that each of the units 106 is vertically movable and is rotatable about an axis line thereof. The mounting units 106 are intermittently revolved by a head drive device 110, and each of the units 106 is moved downward and upward at a unit elevating and lowering station as one of a plurality of stop positions.

All the mounting units 106 are simultaneously rotated about their respective axis lines. When the mounting units 106 are rotated about their axis lines, respective rotation positions of respective components held by the units 106 are changed. The mounting unit 106 that is currently positioned at the unit elevating and lowering station takes, by suction, a component, or mounts, by releasing, the component on the circuit substrate.

The mounting-head moving device 102 is an X-Y-robot type moving device, and includes a Y-slide device 112 that moves the mounting head 100 in the front-and-rear direction; and an X-slide device 114 that moves the mounting head 100 in the left-and-right direction. The Y-slide device 112 is supported by a beam 116 as a portion of the main body 14, and includes a Y slide 120 and a Y-axis motor 118 that moves, via a ball screw, the Y slide 120 along Y guides 122. The X-slide device 114 is supported by the Y slide 120, and includes an X slide 128 and an X-axis motor 126 that moves, via a ball screw, the X slide 128 along X guides 130. The mounting head 100 is attached to the X slide 128. The mounting-head moving device 102 moves the mounting head 100 between the component supplying portion 18 and the circuit substrate fixed by the substrate holding portion 20. The X slide 128 supports, in a lower portion thereof, a mark camera 132 (i.e., a CCD camera) as an image taking device that takes images of fiducial marks, etc affixed to the circuit substrate. The mounting-head moving device 102 moves the mark camera 132 together with the mounting head 100.

Figure 5:
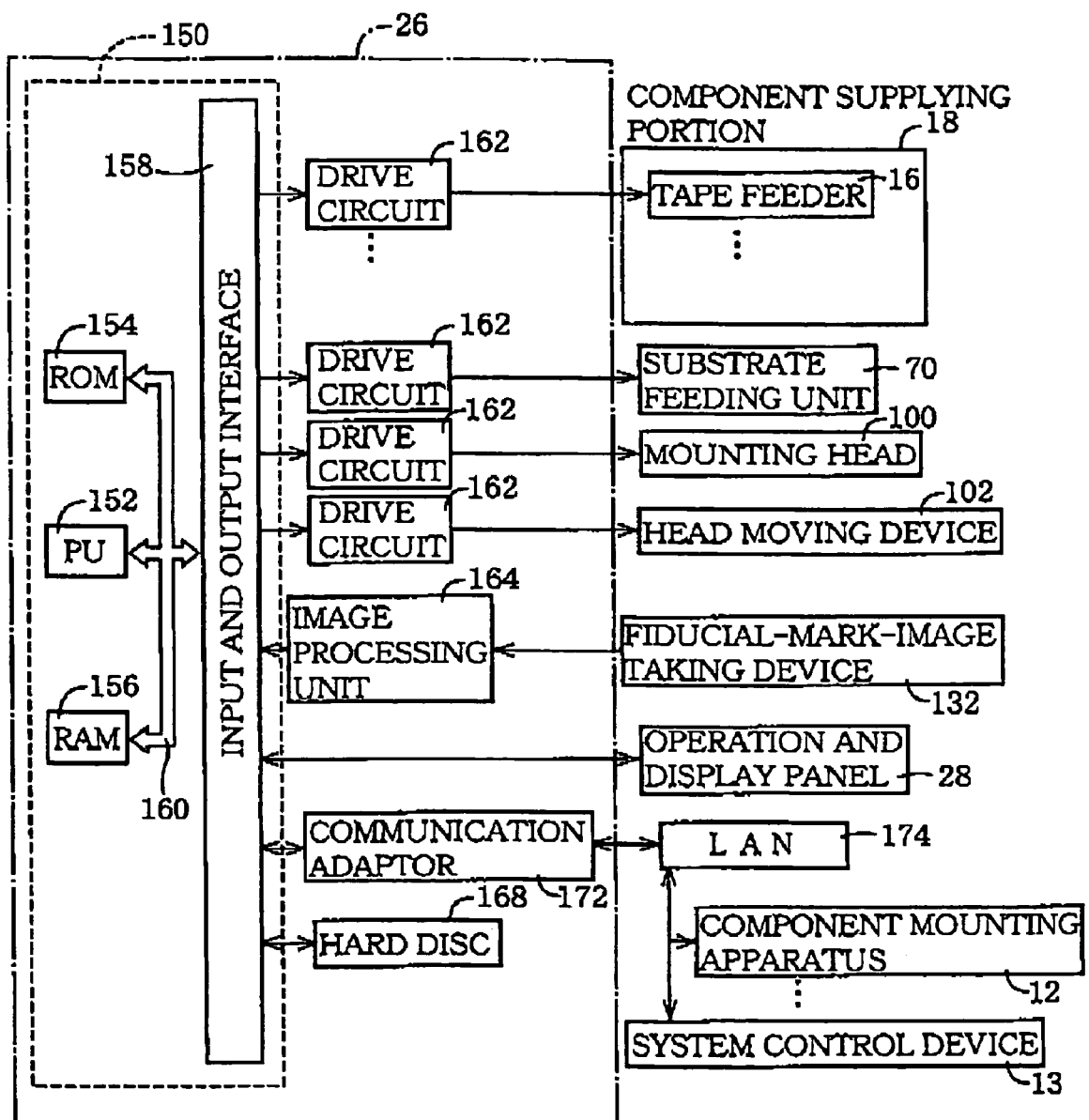
FIG. 5 is a diagrammatic view of a mounting-apparatus control device employed by the component mounting apparatus.

Each of the component mounting apparatuses 12 includes the mounting-apparatus control device 26, shown in the diagrammatic view of FIG. 5. FIG. 5 only shows a relevant portion of the mounting-apparatus control device 26. The mounting-apparatus control device 26 is essentially constituted by a computer 150 including a PU (processing unit) 152, a ROM 154, a RAM 156, an input and output interface 158, and a bus 160 connecting those elements 152, 154, 156, 158 to each other. The feeders 16 of the component supplying portion 18, the substrate feeding unit 70, the mounting head 100, and the mounting-head moving device 102 are connected to the input and output interface 158 via respective drive circuits 162. In addition, the mark camera 132 is connected to the input and output interface 158 via an image processing unit 164 that processes image data representing the images taken by the mark camera 132, to such an extent that various results can be recognized and obtained from the image data. The computer 150, the mark camera 132, and the image processing unit 164 cooperate with each other to constitute a substrate-related-information recognizing device. In addition, the operation and display panel 128 is connected to the input and output interface 158. Moreover, a hard disc 168 is connected to the input and output interface 158. The hard disc 168 is a memory device that stores a plurality of sorts of operation performing programs, data related to a plurality of sorts of circuit components and a plurality of sorts of circuit substrates, etc., such that the programs and the data are readable and writable.

In the present system, all the component mounting apparatuses 12 perform the respective operations while communicating various sorts of signals with each other, and with the system control device 13. To this end, the component mounting apparatuses 12 and the system control device 13 are connected to each other via a LAN (local area network) 174 as an information communication line. The respective input and output interfaces 158 of the respective mounting-apparatus control devices of the component mounting apparatuses 12 are connected to the LAN 174 via respective communication adaptors 172, such that each one of the input and output interfaces 158 can communicate information with the other input and output interfaces 158 and the system control device 13 via the LAN 174, that is, can transmit its own information to the other interfaces 158 and the system control device 13 and receive information from the same 158, 13.

The ROM 154 stores an operating system, etc for controlling the component mounting apparatus 12, and the RAM 156 stores various sorts of data such as substrate-related information. The hard disc 168 stores, e.g., application programs such as mounting programs (each as a sort of operation performing program) each of which includes data representing an order in which components are mounted on a circuit substrate as an object, data representing positions where the components are mounted on the substrate, etc. If, when a resetting operation is carried out, a command to replace the current mounting program with another mounting program is inputted, an appropriate one of the application programs is sent from the hard disc 168 to the RAM 156. Thus, a portion of the RAM 156 constitutes a program storage portion in which a mounting program to be implemented is stored. When the mounting program is implemented by the computer 150, the mounting-apparatus control device 26 sends signals to the various devices via the input and output interface 158, so that the component mounting apparatus 12 performs the mounting operation. Though the application programs such as the mounting programs are stored in the hard disc 168, as described above, those programs are sent from the system control device 13 to the hard disc 168, and are stored in the same 168.

Though not shown, the system control device 13 is essentially constituted by a computer including a PU, a ROM, a RAM, and an input and output interface, and additionally includes an input device such as a keyboard, an output device such as a display, etc. The system control device 13 can communicate various sorts of signals and data with each of the component mounting apparatuses 12, and controls all the component mounting apparatuses 12 in an integrated manner. In addition, the system control device 13 functions as a data base that stores various sorts of data that are needed by the present system. Though the hard disc 168 of the mounting-apparatus control device 26 of each mounting apparatus 12 stores component-related data related to various sorts of components, various sorts of mounting programs related to circuit substrates, etc., the hard disc 168 cannot store all component-related data related to all sorts of components, or all mounting programs related to all sorts of circuit substrates. Therefore, if the current sort of circuit substrates are replaced with a new sort of circuit substrates, then the system control device 13 sends, as needed, appropriate component-related data and mounting program that are needed by the each apparatus 12 to perform a mounting operation on each of the new sort of circuit substrates.

Hereinafter, there will be briefly described a manner in which each component mounting apparatus 12 performs a mounting operation. First, a circuit substrate 86 is fed from the upstream side, and is stopped at the predetermined stop position by the substrate feeding unit 70. The circuit substrate 86 is fixed and held there by the substrate feeding unit 70. More specifically described, the mounting program stored in the program storage portion of the RAM 156 is implemented by the computer 150 and, first, it is confirmed that a width of an appropriate one of the conveyors 72, 74 is adjusted, or has been adjusted, to a value corresponding to the circuit substrate 86. Then, the conveyor 72, 74 of the each component mounting apparatus 12 cooperates with the corresponding conveyor 72, 74 of the upstream-side component mounting apparatus 12 to feed the circuit substrate 86 (however, the No. 1 component mounting apparatus 12 operates in a different manner, described later). The circuit substrate 86 is fed by controlling or driving the conveyor motor 84 such that, e.g., a center of the substrate 86 in a lengthwise direction thereof is positioned at a substantial center of the substrate feeding unit 70 in the substrate-feed direction. A sensor confirms that the circuit substrate 86 has entered the conveyor 72, 74 of the each component mounting apparatus 12, and the conveyor belts are circulated by an amount corresponding to the length of the circuit substrate 86 of the particular sort.

After the circuit substrate 86 is fixed and held by the substrate holding unit 70, the mounting-head moving device 102 moves the mark camera 132 to respective positions above the fiducial marks 182 (see FIG. 6) affixed to the circuit substrate 86, so that the mark camera 132 takes respective images of the fiducial marks. Based on image data representing the thus taken images, positional errors of the circuit substrate 86 fixedly held by the substrate feeding unit 70 are determined. Then, the mounting head 100 is moved to a position above the component supplying portion 18, and the suction nozzles 104 of the head 100 hold, by suction, respective circuit components in a pre-determined sequence according to the mounting program. More specifically described, the mounting unit 106 that is currently positioned at the unit elevating and lowering station is moved to a position above the component supply position on the feeder 16 so as to take a component and, at that position, the unit 106 is lowered while a negative pressure is supplied to the suction nozzle 104 held by the lower end of the unit 106. Thus, the mounting unit 106 holds, by suction, the component. After all the mounting units 106 are intermittently revolved by one angular pitch, the following mounting unit 106 carries out a similar component taking action. Thus, all the mounting units 106 of the mounting head 100 sequentially carry out respective component taking actions. Before each mounting unit 106 carries out the component taking action, the feeder 16 caries out a component feeding action to feed each component to the component supply position.

Then, the mounting head 100 holding the components is moved to a position above the circuit substrate 86, and sequentially mounts, in a pre-determined sequence according to the mounting program, the components held thereby, at respective pre-determined positions on a surface of the circuit substrate 86, such that the mounted components have respective pre-determined rotation positions. More specifically described, the mounting unit 106 that is currently positioned at the unit elevating and lowering station is moved to a position above a pre-determined position on the circuit substrate 86, according to the mounting program.

Then, the mounting unit 106 is rotated about its axis line so that the component held thereby has a pre-determined rotation position. In addition, based on the respective determined amounts of positional errors of the circuit substrate 86, a movement position to which the mounting unit 106 is moved is adjusted. At the thus adjusted movement position, the mounting unit 106 is lowered by a pre-determined distance, while a somewhat positive pressure is supplied to the suction nozzle 104. Thus, the electronic component held by the nozzle 104 is mounted on the surface of the circuit substrate 86. After the mounting units 106 are intermittently revolved by one angular pitch, the following mounting unit 106 carries out a similar component mounting action. Thus, all the mounting units 106 of the mounting head 100 sequentially carry out respective component mounting actions. Till all the components to be mounted have been actually mounted, the mounting head 100 is reciprocated between the component supplying portion 18 and the circuit substrate 86, while repeating the component taking actions and the component mounting actions.

After all the components to be mounted by the component mounting apparatus 12 have been actually mounted, the circuit substrate 86 is released from the fixed and held state thereof. Then, the circuit substrate 86 is fed toward the downstream side by the substrate feeding unit 70. The downstream-side component mounting apparatus 12 performs a similar mounting operation. When all the component mounting apparatuses 12 finish the respective mounting operations on the particular circuit substrate 86, the present system finishes a component mounting operation on the same 86. Thus, the present system mounts circuit components on each of circuit substrates, such that the circuit substrates are fed, one after another, from the upstream side toward the downstream side through the individual component mounting apparatuses 12, and the individual component mounting apparatuses 12 perform the respective pre-programmed mounting operations on each of the circuit substrates. In the present system, the circuit substrates are carried, one after another, into the upstream-side component mounting apparatuses 12, so that the component mounting apparatuses 12 mount the circuit components on the circuit substrates; and the circuit substrates are carried, one after another, out of the downstream-side component mounting apparatuses 12, after the component mounting apparatuses 12 have mounted the circuit components on the circuit substrates. The carrying-in operation to carry the circuit substrates into the component mounting apparatuses 12, and the carrying-out operation to carry the circuit substrates out of the component mounting apparatuses 12 are performed by a carry-in device and a carry-out device that are provided adjacent to the most upstream component mounting apparatus 12 and the most downstream component mounting apparatus 12, respectively, and each of which is essentially constituted by a conveyor device.

<Circuit Substrate>

Figure 6:
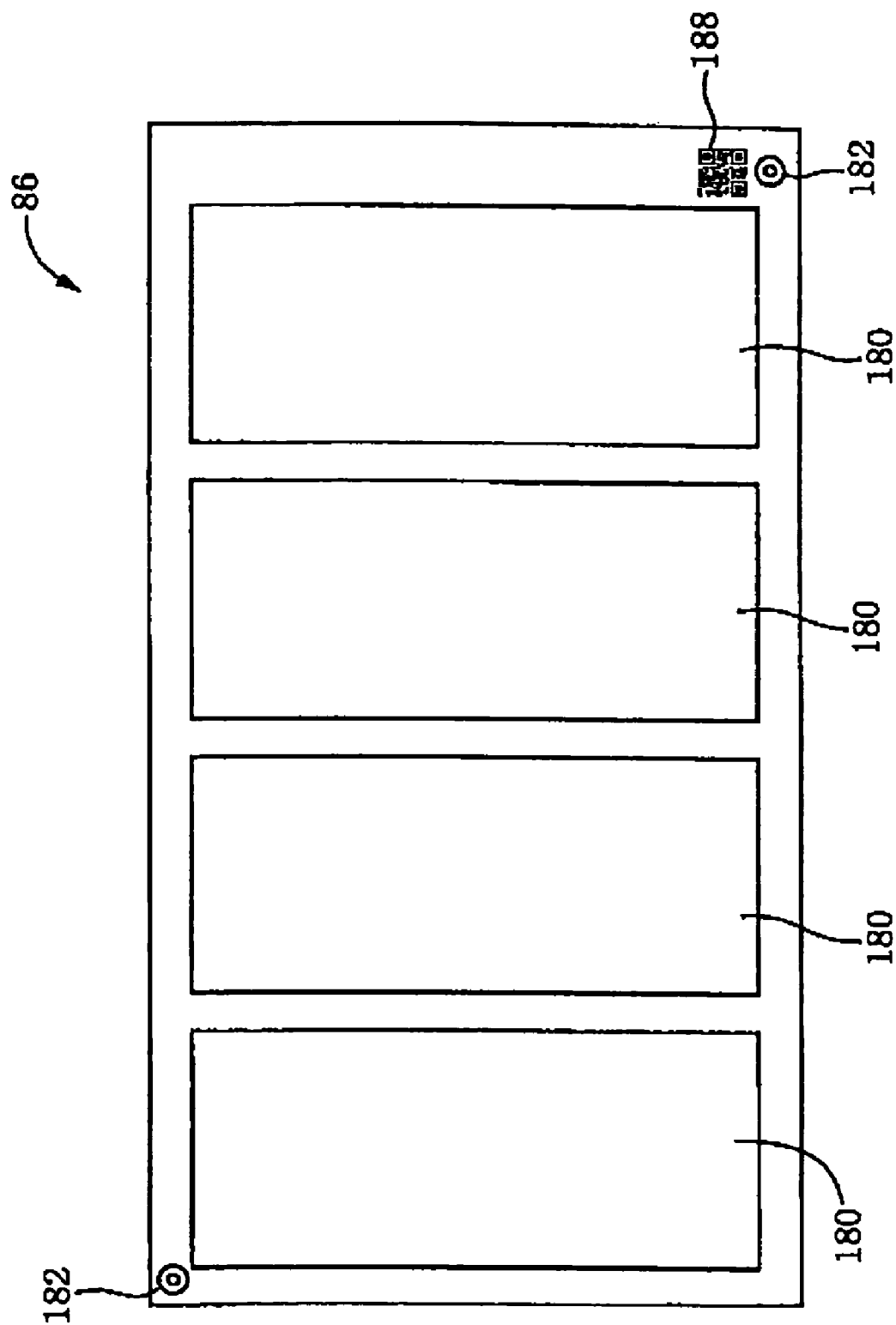
FIG. 6 is an illustrative view of a circuit substrate on which a component mounting operation is performed by the circuit-component mounting system.

In the present embodiment, it is assumed that the component mounting operation is performed on the circuit substrate 86 as shown in FIG. 6. This circuit substrate 86 is a so-called "multiple-part substrate" which consists of four sub-substrates each of which constitutes a divided area of the substrate 86. More specifically described, the circuit substrate 86 includes, as the four sub-substrates, four unit portions 180 each of which has a rectangular shape and which are arranged in the substrate-feed direction. The four unit portions 180 are used to produce four identical circuits, respectively, and accordingly same components are mounted at same positions on each of the four unit portions 180.

The circuit substrate 86 has two fiducial marks 182 at two diagonal positions (a right and lower position and a left and upper position in FIG. 6), respectively. Respective images of the two fiducial marks 182 are taken by the mark camera 132 and, based on image data representing the taken images, positional errors of the circuit substrate 86 fixedly held by the substrate holding unit 70 are detected.

In addition, the circuit substrate 86 has, as a substrate-code indicator as a sort of information indicator, a two-dimensional code (QR code) 188 affixed thereto. The two-dimensional code 188 indicates, as a sort of operation-performed-substrate-related information, a substrate code representing a particular sort of the circuit substrate 86. The two-dimensional code 188 is affixed to the circuit substrate 86, such that a label to which the code 188 is affixed is adhered to the surface of the substrate 86. An image of the two-dimensional code 188 is taken by the mark camera 132, and the substrate code corresponding to the circuit substrate 86 can be recognized by processing the image data representing the taken image. That is, the particular sort of the circuit substrate 86 can be recognized by taking the image of the two-dimensional code 188 affixed to the substrate 86. The two-dimensional code 188 is put on a downstream-side and front corner (i.e., a right and lower corner in FIG. 6) of the circuit substrate 86. All sorts of circuit substrates have respective two-dimensional codes 188 at respective positions whose distances from the upstream-side ends thereof are equal to each other and whose distances from the downstream-side ends thereof are equal to each other. In the present embodiment, one of the two fiducial marks 182 is located in the vicinity of the two-dimensional code 188, such that the one fiducial mark 182 and the code 188 can simultaneously fall in a field of view of the mark camera 132.

<Judging Whether Mounting Program is Appropriate>

In the component mounting system constructed as described above, whether a mounting program is appropriate for each of the component mounting apparatuses 12 is judged in the following manner:

i) Re-Setting of Component Mounting Apparatus

In the present embodiment, a judgment about whether a mounting program is appropriate is made when each component mounting apparatus 12 is re-set. The re-setting of each component mounting apparatus 12 is carried out when, in the present system, the current sort of circuit substrates 86 as operation objects are changed to a new sort of circuit substrates 86. A re-setting procedure includes changing the current sorts of components to new sorts of components, by changing the reels 46 held by the respective reel holding portions 42 of the feeders 16 of the component supplying portion 18, or changing the current feeders 16 to new feeders 16; changing the respective current positions of the support pins provided on the support plates 90, to respective new positions; changing the current mounting program to a new mounting program, etc. However, a re-setting procedure may not include all the above-indicated changing operations, that is, may not include one or more unnecessary changing operations. For example, a re-setting operation may be carried out by only changing the current mounting program to a new mounting program.

In the present embodiment, each component mounting apparatus 12 can be re-set in an arbitrary one of three different methods, that is, (a) an individual re-setting method, (b) a group re-setting method, and (c) an all-apparatus re-setting method.

(a) In the individual re-setting method, the component mounting apparatuses 12 are individually re-set as a circuit substrate 86 is fed from the upstream side toward the downstream side. More specifically described, when the current sort of circuit substrates 86 are changed to a new sort of circuit substrates 86, first, the component mounting apparatus 12 that has finished its mounting operation on the most upstream one of the current sort of circuit substrates 86 is re-set and, each time the most upstream substrate 86 is fed downstream and the next component mounting apparatus 12 has finished its mounting operation on the substrate 86, the next apparatus 12 is re-set. In short, when the present system finishes its mounting operation on the current sort of circuit substrates, the component mounting apparatuses 12 are re-set, one by one, in the order from the upstream side toward the downstream side. In the individual re-setting method, generally, the particular component mounting apparatus 12 being currently re-set is temporarily stopped from performing its operation, and the other apparatuses 12 are allowed to perform their operations. However, if the re-setting procedure is carried out by just changing the current mounting program to a new mounting program, the component mounting apparatus 12 may be re-set while it is performing its operation on the current circuit substrate 86. In this case, the new mounting program is used by the apparatus 12 for the next circuit substrate 86 following the current circuit substrate 86. Thus, the individual re-setting method requires each component mounting apparatus 12 to be temporarily stopped for a considerable short time only.

(b) In the group re-setting method, a group of component mounting apparatuses 12 out of all the apparatuses 12 employed by the present system are re-set concurrently. For example, after all four apparatuses 12 out of the eight apparatuses 12 have finished their operations, the four apparatuses 12 are temporarily stopped from performing their operations and, in this state, the four apparatuses 12 are re-set, one by one, in an arbitrary order. Those four apparatuses 12 are pre-programmed to be concurrently re-set, and accordingly will be referred to as the "concurrent-change group". All the apparatuses 12 belonging to the concurrent-change group are temporarily stopped from performing their operations, and are re-set one by one. Since, in the group re-setting method, the plurality of component mounting apparatuses 12 are stopped for being re-set, a somewhat longer time can be used to carry out the re-setting operations, as compared with the individual re-setting method. In addition, a plurality of operators can carry out the respective re-setting procedures on the individual component mounting apparatuses 12.

(c) In the all-apparatus re-setting method, all the component mounting apparatuses 12 employed by the present system are temporarily stopped and are concurrently re-set. After all the apparatuses 12 have finished their operations on the current sort of circuit substrates 86, all the apparatuses 12 are re-set. Therefore, in a state in which the current sort of circuit substrates 86 have been carried out from all the apparatuses 12, the apparatuses 12 are re-set. This method is employed in the case where the re-setting procedures need much time and labor. In other respects, the all-apparatus re-setting method is similar to the above-described group re-setting method.

ii) Judging Program

The new mounting program employed in the re-setting procedure is checked according to a mounting-program judging program as a sort of operation-performing-program judging program. The judging program is implemented in an arbitrary one of three judging modes, i.e., (i) an individual change mode, (ii) a group change mode, and (iii) an all-apparatus change mode that correspond to the above-described three re-setting methods, respectively. Here, it is assumed that an appropriate one of the three judging modes is selected before a re-setting procedure is carried out.

The judging program includes a main routine, and a plurality of sub-routines that are respective programs to carry out respective judging operations corresponding to the above-indicated three judging modes. The main routine is used to implement, according to the judging mode that is pre-set by the operator so as to correspond to the re-setting method, or the judging mode selected when the re-setting procedure is carried out, an appropriate one of the sub-routines, so as to judge whether the mounting program is appropriate. Thus, the main routine is used to manage the three sub-routines each of which substantially functions as the judging program, and accordingly the main routine is not illustrated or described in detail. The judging program is implemented by the computer 150 of the mounting-apparatus control device 26 of each of the component mounting apparatuses 12.

iii) Judging Program—First Individual Judging Routine

First, there will be described a judgment about whether a mounting program selected in (a) the individual re-setting method is appropriate. In this case, the mounting-apparatus control device 26 of each of the component mounting apparatuses 12 implements the judging program with respect to the each apparatus 12 itself as a judgment-object operation performing apparatus, i.e., the new mounting program employed by the each apparatus 12. Thus, all the eight component mounting apparatuses 12 can each be regarded as a judgment-object operation performing apparatus. However, for easier understanding purposes only, there will be described an exemplary case where the judging program is implemented with respect to the No. 6 component mounting apparatus 12 as the judgment-object operation performing apparatus.

Figure 7:
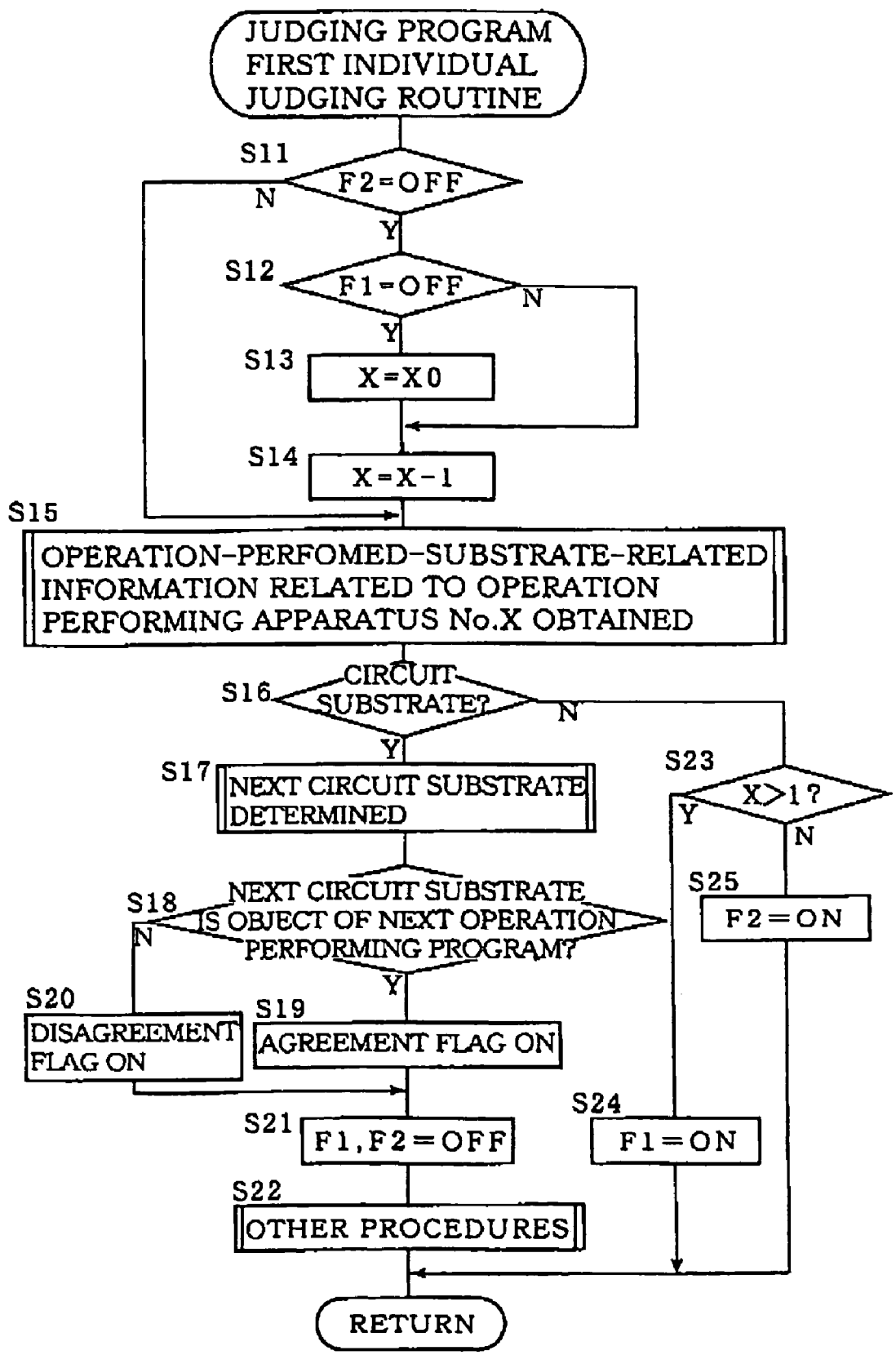
FIG. 7 is a flow chart representing a first individual judging routine of a judging program for judging a mounting program.

Here, it is assumed that for the No. 6 component mounting apparatus 12, the individual change mode is pre-selected to judge whether a mounting program is appropriate, according to a first individual judging routine. For example, when an operator inputs, into the operation and display panel 28, a command to change the current mounting program to a new mounting program, the new mounting program is transmitted, as the next operation performing program, from the hard disc 168 to the RAM 156, and whether the next operation performing program is appropriate is judged according to the first individual judging routine. FIG. 7 shows a flow chart representing the first individual judging routine as the sub-routine corresponding to the individual change mode of the judging program. This flow chart will be described below.

When the flow chart is started, flags F1, F2 are each in an OFF state. Therefore, the control of the computer 150 goes to Step S13 and the following steps. More specifically described, at Step S13, the computer 150 stores, as a parameter X, the number, No. X0, allotted to the component mounting apparatus 12 as the judgment-object operation performing apparatus (since the judgment-object operation performing apparatus is the No. 6 component mounting apparatus itself, "6" is stored). Then, at Step S14, the computer 150 selects the No. 5 component mounting apparatus 12 whose number is smaller by one than the component mounting apparatus 12 whose number has been stored at Step S13. Subsequently, at Step S15, the computer 150 obtains a substrate code as a sort of operation-performed-substrate-related information related to the No. 5 component mounting apparatus 12 selected at Step S4. If the No. 5 component mounting apparatus 12 is performing a mounting operation on a circuit substrate 86, then the computer 150 obtains a substrate code representing the sort of the circuit substrate 86, and a positive judgment is made at Step S16. On the other hand, if not, the computer 150 receives a signal indicating that there is no circuit substrate 86.

The method of obtaining the substrate code will be described in more detail. First, the computer 150 of the No. 6 component mounting apparatus 12 sends, via the LAN 174, a signal to request the computer 150 of the No. 5 component mounting apparatus 12 to supply the substrate code. If the No. 5 component mounting apparatus 12 is performing the mounting operation on a circuit substrate 86, the computer 150 of the No. 5 apparatus 12 has, in the RAM 156 thereof, the substrate code representing the sort of the circuit substrate 86. Therefore, when the computer 150 of the No. 5 apparatus 12 receives the request signal from the computer 150 of the No. 6 apparatus 12, the former computer 150 supplies, via the LAN 174, the substrate code to the latter computer 150. Thus, the computer 150 of the No. 6 apparatus 12 stores, in the RAM 156 thereof, the supplied substrate code as the operation-performed-substrate-related information related to the No. 5 apparatus 12. As previously described, each component mounting apparatus 12 obtains, as the substrate code, the two-dimensional code 188 that is affixed to the circuit substrate 86 and is read by the substrate-related-information recognizing device after the substrate 86 enters the each apparatus 12. The substrate code is stored as the operation-performed-substrate-related information in the RAM 156. However, after the each apparatus 12 has finished the operation on the circuit substrate 86 and the substrate 86 is fed downstream to the downstream-side component mounting apparatus 12, the substrate code is deleted from the RAM 156.

If, at Step S16, it is found that the No. 5 component mounting apparatus 12 is performing a mounting operation on a circuit substrate 86, then the control goes to Step S17 to store, in the RAM 156, the substrate code obtained at Step S15, as a substrate code representing the next circuit substrate 86. Subsequently, at Step S18, the computer 150 judges whether the stored substrate code is identical with a substrate code representing a sort of circuit substrates 86 corresponding to the next operation performing program. If a positive judgment is made at Step S18, the control goes to Step S19 to switch an agreement flag to an ON state. On the other hand, if a negative judgment is made at Step S18, the control goes to Step S20 to switch a disagreement flag to an ON state. Here, it is noted that the substrate code representing the sort of circuit substrates 86 corresponding to the next operation performing program is used as a portion of a name of a mounting program as the next operation performing program, and accordingly the substrate code is obtained from the name of the mounting program and is stored in the RAM 156, when the mounting program is selected by the operator. Based on the thus stored substrate code related to the next operation performing program, whether the next operation performing program is appropriate is judged.

After the agreement flag is switched to the ON state at Step S19, or after the disagreement flag is switched to the ON state at Step S20, the control goes to Step S21 to switch flags F1, F2 each to the OFF state. Then, at Step S22, the computer 150 carries out other procedures, such as deletion of the substrate code as the operation-performed-substrate-related information that is related to the other component mounting apparatus 12 and is stored in the RAM 156. Then, the control goes back to the main routine.

If the agreement flag or the disagreement flag is in the ON state, then the display panel 28 displays a judgment result, according to the main routine. More specifically described, if the agreement flag is in the ON state, the display panel 28 indicates that the mounting program is correct, and the No. 6 component mounting apparatus 12 allows the next circuit substrate 86 (i.e., the circuit substrate on which the operation has been performed by the No. 5 component mounting apparatus 12) to enter itself, and starts an operation at the time when the next substrate 86 enters. When the next substrate 86 enters the apparatus 12, the agreement flag is switched back to the OFF state. On the other hand, if the disagreement flag is in the ON state, the display panel 28 displays a caution, and the No. 6 component mounting apparatus 12 as the judgment-object component mounting apparatus is inhibited from performing an operation and the next circuit substrate 86 is inhibited from entering the No. 6 apparatus 12. In this case, if the operator selects a correct mounting program, the disagreement flag is switched back to the OFF state, and the first individual judging routine is implemented again. If the agreement flat is switched to the ON state, then the next circuit substrate 86 is allowed to enter the No. 6 apparatus 12.

If, at Step S16, it is found that the No. 5 component mounting apparatus 12 is not performing an operation, the control goes to Step S23 to judge whether parameter X is greater than 1 (i.e., whether it has been attempted to obtain operation-performed-substrate-related information from the most upstream component mounting apparatus 12). If a positive judgment is made (e.g., parameter X is 5), the control goes to Step S24 to switch flag F1 to the ON state, and thus a current control cycle according to the first individual judging routine is ended.

Under a certain condition, all the subroutines including the first individual judging routine are repeatedly implemented in a short time, according to the main routine. Regarding the first individual judging routine, if, for example, the individual judging mode is selected and the current mounting program is replaced with a new mounting program, the first individual judging routine is repeatedly implemented till a certain judgment result is obtained. If the agreement flag or the disagreement flag is switched to the ON state, then the computer 150 recognizes that the judging has ended, and quits the first individual judging routine.

Since, in the current control cycle, a positive judgment is made at Step S23 and the agreement flag and the disagreement flag are each in the OFF state, the first individual judging routine is immediately implemented again. Since flag F1 is in the ON state, a negative judgment is made at Step S12, and accordingly Step S13 is skipped. At Step S14, parameter X is decreased by one. In the current control cycle, No. X of the operation performing apparatus is decreased from 5 to 4. Thus, the computer 150 obtains a substrate code as a sort of operation-performed-substrate-related information related to the No. 4 component mounting apparatus 12. If the No. 4 apparatus 12 is performing an operation on a circuit substrate 86, Steps S17 through S22 are carried out as described above. On the other hand, if a negative judgment is made at Step S16, the control goes to Step S23. Since a positive judgment is made at Step S23 and flag F1 is switched to the ON state at Step S24, the control goes back to the main routine, and immediately the first individual judging routine is implemented once more.

If, in this way, the computer 150 obtains the substrate code representing the sort of the circuit substrate 150 on which the operation is being performed by any one component mounting apparatus 12, the computer 150 stores the substrate code as the next circuit substrate. On the other hand, if none of the component mounting apparatuses 12 located on the upstream side of the judgment-object operation performing apparatus (i.e., the No. 6 component mounting apparatus 12) is performing an operation on a circuit substrate 86, Steps S11 through S16 and S23 through S25 are repeated till parameter X becomes equal to 1. Then, since a negative judgment is made at Step S23, and flag F2 is switched to the ON state at Step S25, the control returns to the main routine. Then, when the first individual judging routine is implemented, a negative judgment is made at Step S11, and Steps S12 through S14 are skipped. At Step S15, the computer 150 attempts to obtain operation-performed-substrate-related information related to the No. 1 component mounting apparatus 12. If at Step S16 it is found that the No. 1 apparatus 12 is performing an operation on a circuit substrate 86, Steps S17 through S22 are carried out. On the other hand, if a negative judgment is made at Step S16, flag F2 is kept to the ON state at Step S25, and the control goes back to the main routine. Thus, if the No. 1 component mounting apparatus 12 performs an operation on a new circuit substrate 86 and the computer 150 obtains a substrate code of the new substrate 86, then a judgment result is obtained.

As is apparent from the foregoing description of the judgment about whether the mounting program is appropriate in the individual re-setting method, Steps S11 through S16, S23, and S24 of the first individual judging routine cooperate with each other to constitute an operation-performed-substrate-information obtaining step (as a reference-information obtaining step); and those steps cooperate with a portion of the computer 150 of the mounting-apparatus control device 26 that carries out those steps, and the communication adaptor 172 that communicates information with the other component mounting apparatuses 12 to constitute a reference-information obtaining portion. In addition, Steps S16 and S17 of the first individual judging routine cooperate with each other to constitute a next-circuit-substrate recognizing step; and those steps cooperate with a portion of the computer 150 that carries out those steps to constitute a next-circuit-substrate recognizing portion. Moreover, Steps S18 through S20 of the first individual judging routine cooperate with each other to constitute a next-circuit-substrate-dependent judging step (as a judging step); and those steps cooperate with a portion of the computer 150 that carries out those steps to constitute a next-circuit-substrate-dependent judging portion. The next-operation-performed-substrate recognizing portion and the next-circuit-substrate-dependent judging portion cooperate with each other to constitute a judging portion that cooperates with the above-described reference-information obtaining portion to constitute a program judging device.

iv) Program Judging Operation by Most Upstream Component Mounting Apparatus

In the individual judging mode, the No. 1 component mounting apparatus 12 cannot obtain operation-performed-substrate-related information related to a component mounting apparatus 12 located on the upstream side of the No. 1 apparatus 12, because the No. 1 apparatus 12 is the most upstream apparatus. Hence, in the present embodiment, the No. 1 apparatus 12 is adapted such that the substrate-related-information recognizing device thereof obtains, as operation-performed-substrate-related information, a substrate code representing a sort of a circuit substrate 86 that is carried thereinto and the computer 150 judges, based on the obtained substrate code, whether the next operation performing program is appropriate. However, a flow chart representing a judging program for judging whether the next operation performing program for the No. 1 apparatus 12 is appropriate, is not shown.

In the present embodiment, each of the component mounting apparatuses 12 other than the No. 1 apparatus 12 is adapted such that the respective widths of the two conveyors 72, 74 of the substrate feeding unit 70 that convey respective circuit substrates 86 are adjusted according to the mounting program. As described above, in the individual judging mode, whether the mounting program is appropriate is judged based on the operation-performed-substrate-related information related to the upstream-side component mounting apparatus 12. Therefore, an incorrect mounting program cannot possibly be used to adjust the widths of the conveyors 72, 74. However, on the upstream side of the No. 1 apparatus 12, there is provided only the substrate carry-in device that is essentially constituted by the conveyor device and has just the function of supplying circuit substrates 86 to the No. 1 apparatus 12. Thus, the substrate carry-in device does not employ a substrate-related-information recognizing device and accordingly does not obtain operation-performed-substrate-related information related to each circuit substrate 86 to be supplied to the No. 1 apparatus 12. That is, the substrate carry-in device cannot supply information based on which the No. 1 apparatus 12 can judge whether the next operation performing program is appropriate. If an incorrect mounting program is used to adjust the widths of the conveyors 72, 74 of the No. 1 apparatus 12, the circuit substrates 86 may not be able to enter the No. 1 apparatus 12. To solve this problem, the conveyors 72, 74 of the No. 1 apparatus 1 are adapted such that the widths of the conveyors 72, 74 automatically follow the width of the conveyor device of the substrate carry-in device, so as to allow the circuit substrate 86 of any width to enter the No. 1 apparatus 12. Though not described in detail, in an upstream-side end portion of each of the conveyor rails 78, 82, there is provided a photo-electric sensor that can detect a position of a downstream-side end of a conveyor rail of the substrate carry-in device. Thus, when a circuit substrate 86 is carried into each of the conveyors 72, 74, a position of the each conveyor rail 78, 82 is adjusted.

Since, in this way, the widths of the conveyors 72, 74 are adjusted to follow the widths of the circuit substrates 86, the circuit substrates 86 of any width can enter the No. 1 component mounting apparatus 12, irrespective of which mounting program the next operation performing program may be. To this end, the No. 1 apparatus 12 is adapted such that the substrate-related-information obtaining device thereof reads the two-dimensional code 188 affixed to the circuit substrate 86 that has been carried therein, and therefore the apparatus 12 can obtain the substrate code of the circuit substrate 86. The computer 150 judges whether the next operation performing program is appropriate, by comparing the thus obtained substrate code with the substrate code representing the sort of circuit substrates corresponding to the next operation performing program. Thus, the judgment about the No. 1 apparatus 1 includes recognizing the next circuit substrate based on the operation-performed-substrate-related information related to the judgment-object operation performing apparatus itself.

v) Judging Program—Group Judging Routine

Figure 8:
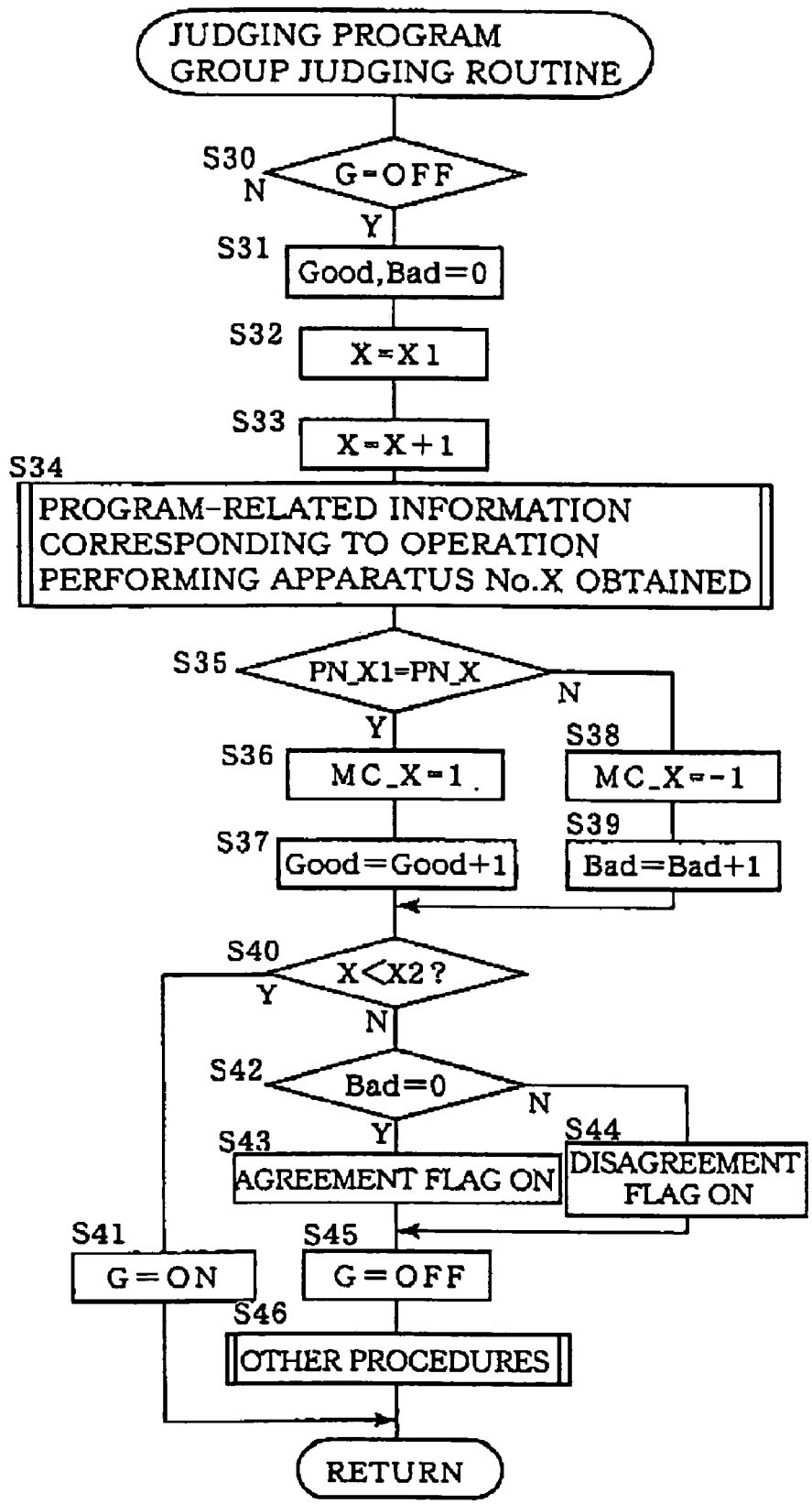
FIG. 8 is a flow chart representing a group judging routine of the judging program.

Next, there will be described judgments about whether mounting programs selected in (b) the group re-setting method are appropriate. For easier understanding purposes only, it is assumed that the five component mounting apparatuses 12, No. 5 through No. 8, belong to the above-described concurrent-change group. In addition, it is assumed that the No. 4 apparatus 12 is a judgment-object operation performing apparatus, and a mounting program selected for the No. 4 apparatus 12 in the group change mode is checked. Moreover, it is assumed that the number "8" of the No. 8 apparatus 12 is stored as the number allotted to the most downstream component mounting apparatus 12 of all the apparatuses 12 belonging to the concurrent-change group. In the group change mode, the five apparatuses 12 are temporarily stopped from performing respective operations. When the operator inputs, into the operation and display panel 28, a command to start judging the mounting programs after the re-setting procedures are carried out, the computer 150 implements a group judging routine to check the mounting programs. In the present embodiment, when the operator inputs the command into the No. 4 apparatus 12 as the most upstream apparatus 12 of the five apparatuses 12 belonging to the concurrent-change group, the computer 150 of the No. 4 apparatus 12 starts the group judging routine. FIG. 8 shows a flow chart representing the group judging routine as the sub-routine corresponding to the group change mode of the judging program. This flow chart will be described below.

When the flow chart is started, flag G is in an OFF state. Therefore, a positive judgment is made at Step S30, and accordingly the control of the computer 150 goes to Step S31 to change parameter Good and parameter Bad each to zero. Then, at Step S32, the computer 150 changes parameter X to constant X1. Since constant X1 indicates the number allotted to the most upstream component mounting apparatus 12 of all the apparatuses 12 belonging to the concurrent-change group, the number "4" is stored as parameter X. Subsequently, at Step S33, parameter X is increased by one. In the current control cycle, parameter X is increased to 5. At Step S34, the computer 150 obtains a portion of a program's name as a sort of program-related information corresponding to the No. 5 component mounting apparatus 12. The name of each mounting program includes a portion corresponding to a sort of circuit substrates 86. In the present embodiment, a pre-determined number of characters of each program's name, as counted from the head of the each name, define a substrate code representing the sort of circuit substrates 86 corresponding to the mounting program. That is, the computer 150 can recognize, based on each program's name, the sort of the circuit substrates 86 each as an object of an operation according to the mounting program. Hereinafter, the substrate code recognized based on the program's name will be referred to as the "operation-object code". Here, the manner in which the operation-object code is obtained is described. When the operator selects a mounting program through the operation and display panel 28 of each of the five component mounting apparatuses 12, the selected mounting program is sent from the hard disc 168 to the RAM 156 of the computer 150 of the each apparatus 12. At that time, the computer 150 obtains the operation-object code, based on the name of the selected mounting program, and stores the operation-object code in the RAM 156 thereof. The thus stored operation-object code can be transmitted and received as information among the apparatuses 12 in the above-described manner. Thus, the operation-object code is program-related information.

Then, at Step S35, the computer 150 judges whether an operation-object code, PN_X1, stored by the No. 4 component mounting apparatus 12 is identical with an operation-object code, PN_X, stored by the No. X component mounting apparatus 12. In the current control cycle, parameter X is 5. If a positive judgment is made at Step S35, then the control goes to Step S36 to change parameter MC_X to MC_X=1 indicating that a portion of the name of the mounting program selected for the No. X apparatus 12 is identical with a portion of the name of the mounting program selected for the No. 4 apparatus 12. In the current control cycle, parameter MC_5 is 1. Then, the control goes to Step S37 to increase parameter Good by one. In the current control cycle, parameter Good is 1. On the other hand, if a negative judgment is made at Step S35, then the control goes to Step S38 to change parameter MC_X to MC_X=-1. Then, the control goes to Step S39 to increase parameter Bad by one. Subsequently, the control goes to Step S40 to judge whether parameter X is smaller than constant X2 indicating the above-described number allotted to the most downstream component mounting apparatus 12 of all the apparatuses 12 belonging to the concurrent-change group, i.e., X2=8. Since a positive judgment is made at Step S40, the control goes to Step S41 to switch flag G to an ON state, and goes back to the main routine.

Immediately, the group judging routine is implemented again. Since flag G is in the ON state, a negative judgment is made at Step S30, and accordingly Steps S31 and S32 are skipped. At Step S33, parameter X is increased by one. In the current control cycle, parameter X is increased to 6. At Step S34, the computer 150 obtains an operation-object code stored by the No. 6 component mounting apparatus 12. At Step S35, the computer 150 judges whether the operation-object code stored by the No. 4 component mounting apparatus 12 is identical with the operation-object code stored by the No. 6 apparatus 12. If a positive judgment is made at Step S35, then the control goes to Steps S36 and S37; and, if a negative judgment is made at Step S35, then the control goes to Steps S38 and S39. Subsequently, the control goes to Step S40. Since parameter X is 6 and is smaller than constant X2=8, a positive judgment is made at Step S40, and the control goes back to the main routine while flag G is kept to the ON state.

When the above-described steps are repeated and parameter X becomes equal to 8, a negative judgment is made at Step S40 of the group judging routine. Thus, the control goes to Step S42 to judge whether parameter Bad is equal to zero. Parameter Bad is increased by one each time it is judged that the operation-object code stored by the No. X1 component mounting apparatus 12 (i.e., the No. 4 apparatus 12) is not identical with the operation-object code stored by the No. X apparatus 12 (i.e., each of the No. 5 through No. 8 apparatuses 12). Therefore, a judgment that parameter Bad is zero indicates that the respective operation-object codes stored by all of the five apparatuses 12 are identical with each other. If a positive judgment is made at Step S42, the control goes to Step S43 to switch the agreement flag to the ON state; and if a negative judgment is made at Step S42, the control goes to Step S44 to switch the disagreement flag to the ON state. After Step S44 or Step S45, the control goes to Step S46 to carry out other procedures, such as deletion of the operation-object codes that are related to the other apparatuses 12 and are stored in the RAM 156. Thus, the control quits the group judging routine, and returns to the main routine.

The following procedures are carried out in the same manner as the manner in which the corresponding procedures of the first individual judging routine are carried out. It is, however, noted that when the disagreement flag is switched to the ON state, the number or numbers "No. X" of the component mounting apparatus or apparatuses 12 that stores or store the operation-object code or codes differing from the operation-object code stored by the No. 4 apparatus 12, is or are displayed. That is, the number or numbers "No. X" of the apparatus or apparatuses 12 for which parameter or parameters MC_X=−1 has or have been stored is or are displayed. In this case, the mounting program selected for the No. 4 component mounting apparatus 12 as the judgment-object operation performing apparatus may not be appropriate and, for this reason, it can be estimated that the selected mounting program is inappropriate. Eventually, the computer 150 of the No. 4 apparatus 12 judges that the mounting program selected for the No. 4 apparatus 12 is not appropriate.

As is apparent from the foregoing description of the group judging routine, the computer 150 of the No. 4 component mounting apparatus 12 implements the judging program, and judges whether the mounting program selected for the No. 4 apparatus 12 itself is appropriate. Thus, the No. 4 apparatus 12 as the judgment-object operation performing apparatus includes the judging device that judges whether the mounting program selected for the No. 4 apparatus 12 itself is appropriate. On the other hand, regarding, for example, the No. 5 apparatus 12, the No. 4 apparatus 12 compares the operation-object code stored by the No. 4 apparatus 12 with the operation-object code stored by the No. 5 apparatus 12, and judges whether the mounting program selected for the No. 5 apparatus 12 is appropriate, by judging whether the two operation-object codes are identical with each other. Thus, regarding the No. 5 apparatus 12 as the judgment-object operation performing apparatus, a different component mounting apparatus 12 than the No. 5 apparatus 12 judges whether the mounting program selected for the No. 5 apparatus 12 is appropriate. Stated differently, the No. 4 apparatus 12 judges whether the mounting program selected for the No. 5 apparatus 12 is appropriate. This is also the case with each of the No. 6 through No. 8 apparatuses 12. In other words, the No. 4 apparatus 12 judges whether the mounting program selected for each of the other apparatuses 12 belonging to the concurrent-change group is appropriate, or judges whether the mounting program selected for each of all the apparatuses 12 belonging to the concurrent-change group and including the No. 4 apparatus 12 itself is appropriate.

Thus, Steps S30 through S34, S40, and S41 of the group judging routine cooperate with each other to constitute a program-related information obtaining step (as the reference-information obtaining step); and those steps cooperate with a portion of the computer 150 of the mounting-apparatus control device 26 that carries out those steps, and the communication adaptor 172 that communicates information with the other component mounting apparatuses 12 to constitute the reference-information obtaining portion. In addition, Steps S35 through S39, and S42 through S44 of the group judging routine cooperate with each other to constitute a program-related-information-dependent judging step (as the judging step); and those steps cooperate with a portion of the computer 150 that carries out those steps to constitute a program-related-information-dependent judging portion. The program-related-information-dependent judging portion constitutes a portion of the judging portion that cooperates with the above-indicated reference-information obtaining portion to constitute the program judging device.

vi) Judging Program—All-Apparatus Judging Routine

Next, there will be described judgments about whether mounting programs selected in (c) the all-apparatus re-setting method are appropriate. This case is equivalent to the case where the above-described group judging routine is applied to a concurrent-change group including all the eight component mounting apparatuses, No. 1 through No. 8. In this case, for example, the No. 1 apparatus 12 is pre-selected as a judgment-object operation performing apparatus, so that respective mounting programs selected in the all-apparatus change mode may be checked, and additionally the number "8" of the No. 8 apparatus 12 is stored as the number allotted to the most downstream component mounting apparatus 12 of all the eight apparatuses 12. That is, according to the flow chart shown in FIG. 8, 1 is stored as constant X1 indicating the number "No. X" of the most upstream component mounting apparatus 12 in the concurrent-change group; and 8 is stored as constant X2 indicating the number "No. X" of the most downstream component mounting apparatus 12 in the concurrent-change group. Thus, the present routine can be carried out according to the flow chart shown in FIG. 8, and accordingly the description thereof is omitted here.

Constant X1=1 indicates that the No. 1 component mounting apparatus 12 is a judgment-object operation performing apparatus and includes a program judging device. Thus, the above-indicated explanations of the group judging routine with respect to which apparatus 12 is a judgment-object operation performing apparatus and which apparatus 12 checks mounting programs are true with respect to not only the group change mode but also the all-apparatus change mode.

vii) Judging Program—Second Individual Judging Routine

Figure 9:
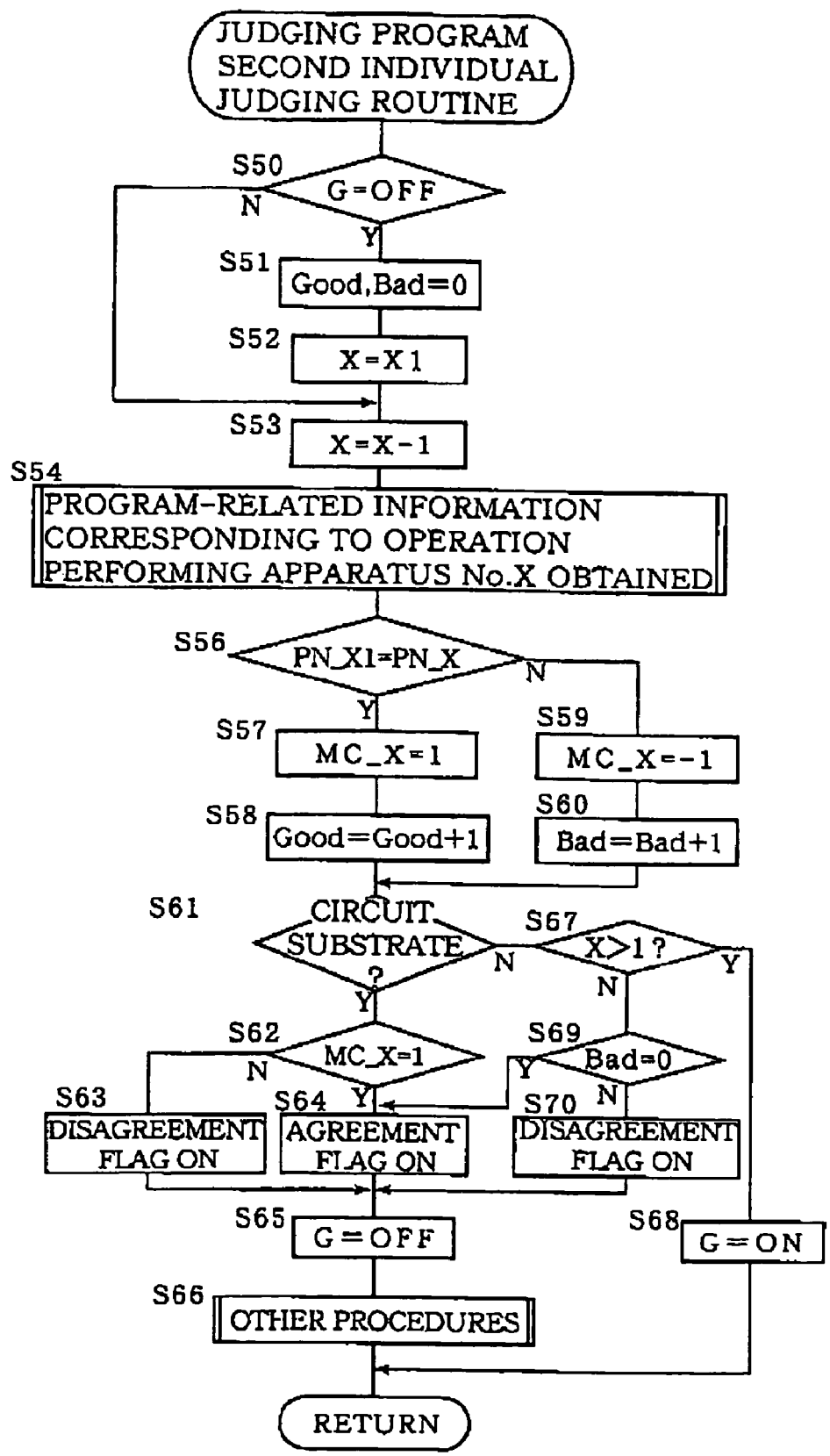
FIG. 9 is a flow chart representing a second individual judging routine of the judging program.

The mounting program selected in (a) the above-described individual re-setting method is checked according to the first individual judging routine of the judging program. In the first individual judging routine, the mounting program selected for the judgment-object operation performing apparatus is checked based on the operation-performed-substrate-related information related to the component mounting apparatus 12 located on the upstream side of the judgment-object apparatus. However, the mounting program selected in the individual re-setting method may be checked based on the program-related information. Hereinafter, there will be described a second individual judging routine according to which the mounting program selected for the judgment-object operation performing apparatus is checked based on the program-related information corresponding to the component mounting apparatus 12 located on the upstream side of the judgment-object apparatus. Thus, the second individual judging routine is particularly advantageous for the case where circuit substrates 86 having no information indicators, such as two-dimensional codes 188, are used. The following description relates to, e.g., the case where the No. 6 component mounting apparatus 12 is pre-selected as a judgment-object operation performing apparatus. FIG. 9 shows a flow chart representing the second individual judging routine as one of the subroutines that corresponds to the individual change mode of the judging program. It is assumed that for the No. 6 component mounting apparatus 12, the individual change mode is pre-selected to judge whether the mounting program selected for the No. 6 apparatus 12 is appropriate, according to the second individual judging routine.

Steps S50 through S54, and S55 through S60 correspond to Steps S30 through S39 of the group judging routine (see FIG. 8), respectively. However, at Step S53, parameter X is decreased by one. Since 6 is stored as constant X1, parameter X is changed to 5, in the initial control cycle according to the second individual judging routine. Subsequently, at Step S54, the computer 150 obtains operation-object code (as the program-related information) corresponding to a component mounting apparatus 12 located on the upstream side of the judgment-object operation performing apparatus.

In the initial control cycle according to the second individual judging routine, the computer 150 judges, at Step S61, whether the No. 5 component mounting apparatus 12 is performing an operation on a circuit substrate 86, i.e., whether the No. 5 apparatus 12 has such a circuit substrate 86 that is in a state after the substrate 86 has started entering the No. 5 apparatus 12 and before the substrate 86 is fed to the following apparatus 12 located on the downstream side of the No. 5 apparatus 12 and in which a mounting operation is performed by the No. 5 apparatus 12. Each of the component mounting apparatuses 12 stores, in the RAM 156 thereof, information indicating whether the each apparatus 12 has such a circuit substrate 86, that is, substrate-holding information (as the operation-performed-substrate-related information) indicating whether the each apparatus 12 holds a circuit substrate 86. At Step S54, the computer 150 obtains, in addition to the program-related information, the substrate-holding information, and stores the thus obtained information, in the RAM 156 of the No. 6 apparatus 12 as the judgment-object operation performing apparatus. At Step S61, the computer 150 makes a judgment based on the thus stored substrate-holding information.

If a positive judgment is made at Step S61, the control goes to Step S62 to judge whether parameter MC_X (e.g., MC_5) is equal to 1. In the case where a positive judgment has been made at Step S56 and parameter MC_X has been set at 1 at Step S57, the operation-object code (as the program-related information) stored by the No. 6 apparatus 12 is identical with the operation-object code stored by the No. 5 apparatus 12. Therefore, the control goes to Step S64 to switch agreement flag to the ON state. On the other hand, if parameter MC_X is set at −1, the control goes to Step S63 to switch disagreement flag to the ON state. Steps S65 and S66 correspond to Steps S45 and S46 of the group judging routine (see FIG. 8), respectively.

On the other hand, if a negative judgment is made at Step S61, the control goes to Step S67 to judge whether parameter X is greater than 1. Since parameter X has been set at 5 in the current control cycle, a positive judgment is made at Step S67, and the control goes to Step S68 to switch flag G to the ON state. Then, the control goes back to the main routine. Immediately, the second individual judging routine is implemented again. Through Steps S50 to S54, the computer 150 obtains the operation-object code and the substrate-holding information corresponding to the No. 4 component mounting apparatus 12. Then, through Steps S56 to S60, the computer 150 compares the two operation-object codes with each other and stores comparison results. If a positive judgment is made at the following Step S61, then Steps S62 through S66 are carried out. On the other hand, if a negative judgment is made at Step S61, then Steps S50 through S61, S67, and S68 are carried out, each time the second individual judging routine is repeated, till parameter X is changed to 1.

As the second individual judging routine is repeated, eventually the computer 150 refers to the most upstream component mounting apparatus 12, and parameter X is changed to 1. Therefore, a negative judgment is made at Step S67, and the control goes to Step S69 to judge whether parameter Bad is equal to zero. Parameter Bad is increased by one each time it is judged that the operation-object code stored by the No. 6 component mounting apparatus 12 is not identical with the operation-object code stored by the No. X apparatus 12 (i.e., each of the No. 5 through No. 1 apparatuses 12). Therefore, a judgment that parameter Bad is zero indicates that the respective operation-object codes stored by all of the six apparatuses 12 are identical with each other. If a positive judgment is made at Step S69, the control goes to Step S64 to switch agreement flag to the ON state. On the other hand, if a negative judgment is made at Step S69, it means that the operation-object code stored by the No. 6 component mounting apparatus 12 is not identical with the operation-object code stored by any of the No. X apparatuses 12. Hence, the control goes to Step S70 to switch disagreement flag to the ON state. Subsequently, the control goes to Step S65 and S66, and then the control returns to the main routine. The following procedures are carried out in the same manner as the manner in which the corresponding procedures of the first individual judging routine or the group judging routine are carried out.

Thus, the second individual judging routine includes the step of judging whether the operation performing program selected for the judgment-object operation performing apparatus is appropriate, based on the program-related information corresponding to the component mounting apparatus 12 that is performing the operation on the most downstream circuit substrate 86 of all the circuit substrates 86 that are located on the upstream side of the judgment-object apparatus. In addition to this judging step, the second individual judging routine includes the step of judging whether the operation performing program is appropriate, even if there may be no such circuit substrates 86 that are located on the upstream side of the judgment-object apparatus. That is, for such cases, the second individual judging routine includes the step of judging whether the mounting program selected for the judgment-object apparatus is appropriate, by judging whether the respective operation-object codes representing the respective mounting programs selected for all the component mounting apparatuses 12 located on the upstream side of the judgment-object apparatus are identical with each other.

Thus, Steps S50 through S54, and S61 through S68 of the second individual judging routine cooperate with each other to constitute the program-related-information obtaining step and a substrate-holding-information obtaining step (each as the reference-information obtaining step); and those steps cooperate with a portion of the computer 150 of the mounting-apparatus control device 26 that carries out those steps, and the communication adaptor 172 that communicates information with the other component mounting apparatuses 12 to constitute the reference-information obtaining portion. In addition, Steps S56 through S60, S62 through S65, S69, and S70 of the second individual judging routine cooperate with each other to constitute a program-related-information-dependent judging step (as the judging step); and those steps cooperate with a portion of the computer 150 that carries out those steps to constitute a program-related-information-dependent judging portion. The program-related-information-dependent judging portion constitutes a portion of the judging portion that cooperates with the above-indicated reference-information obtaining portion to constitute the program judging device.

viii) Complementary Explanations

In the present embodiment, the program judging device is provided in the component mounting apparatus 12 as the judgment-object operation performing apparatus. However, the program judging device may be provided in a component mounting apparatus 12 other than the apparatus 12 as the judgment-object apparatus, or alternatively in the system control device 13. In addition, it is not essential that the judging portion and the reference-information obtaining portion that cooperate with each other to constitute the program judging device be provided in a single operation performing apparatus. For example, the judging portion may be provided in a component mounting apparatus 12, and the reference-information obtaining portion may be provided in the system control device 13. In this case, the computer 150 of the component mounting apparatus 12 carries out the judging step; and the computer of the system control device 13 carries out the reference-information obtaining step. In addition, the plurality of steps constituting the operation-performing-program judging program may be carried out by a plurality of operation performing apparatuses and/or other devices, respectively. For example, the system control device 13 may carry out the reference-information obtaining step to obtain the reference information, and the thus obtained reference information may be transmitted via the LAN 174 to the computer 150 of a component mounting apparatus 12, so that the computer 150 can carry out the judging step based on the reference information.

In the present embodiment, the substrate code is obtained by reading, with the substrate-related-information recognizing device of each of the component mounting apparatuses 12, the two-dimensional code 188 affixed to the circuit substrate 86 carried into the each apparatus 12. However, it is not essential that the respective substrate-related-information recognizing devices be provided in all the component mounting apparatuses 12. For example, it is possible that only the No. 1 apparatus 12 employ the substrate-related-information recognizing device and send the substrate code obtained by the recognizing device, to the component mounting apparatus 12 (i.e., the No. 2 apparatus 12) located on the downstream side of the No. 1 apparatus 12. Since the substrate code is transmitted from the upstream component mounting apparatus 12 to the downstream component mounting apparatus 12, the downstream apparatus 12 need not employ the substrate-related-information recognizing device to obtain the substrate code.

As previously described, in the present embodiment, a mounting program selected by the operator is transmitted from the hard disc 168 to the RAM 156 of a target component mounting apparatus 12, so that the transmitted mounting program is recognized as the next operation performing program, and whether the next operation performing program is appropriate is judged. However, in the case where the re-setting procedure consists of only replacing the current mounting program with a new mounting program, a command to change the current operation performing program to the new operation performing program may be inputted while the component mounting apparatus 12 is performing the current operation. In this case, the program-related information related to the mounting program selected by the operator may be transmitted to the RAM 156, so that, at that time, the mounting program is recognized as the next operation performing program and whether the next operation performing program is appropriate is judged.

<Judging Operation by System Including Solder Printing Apparatus>

Figure 10:
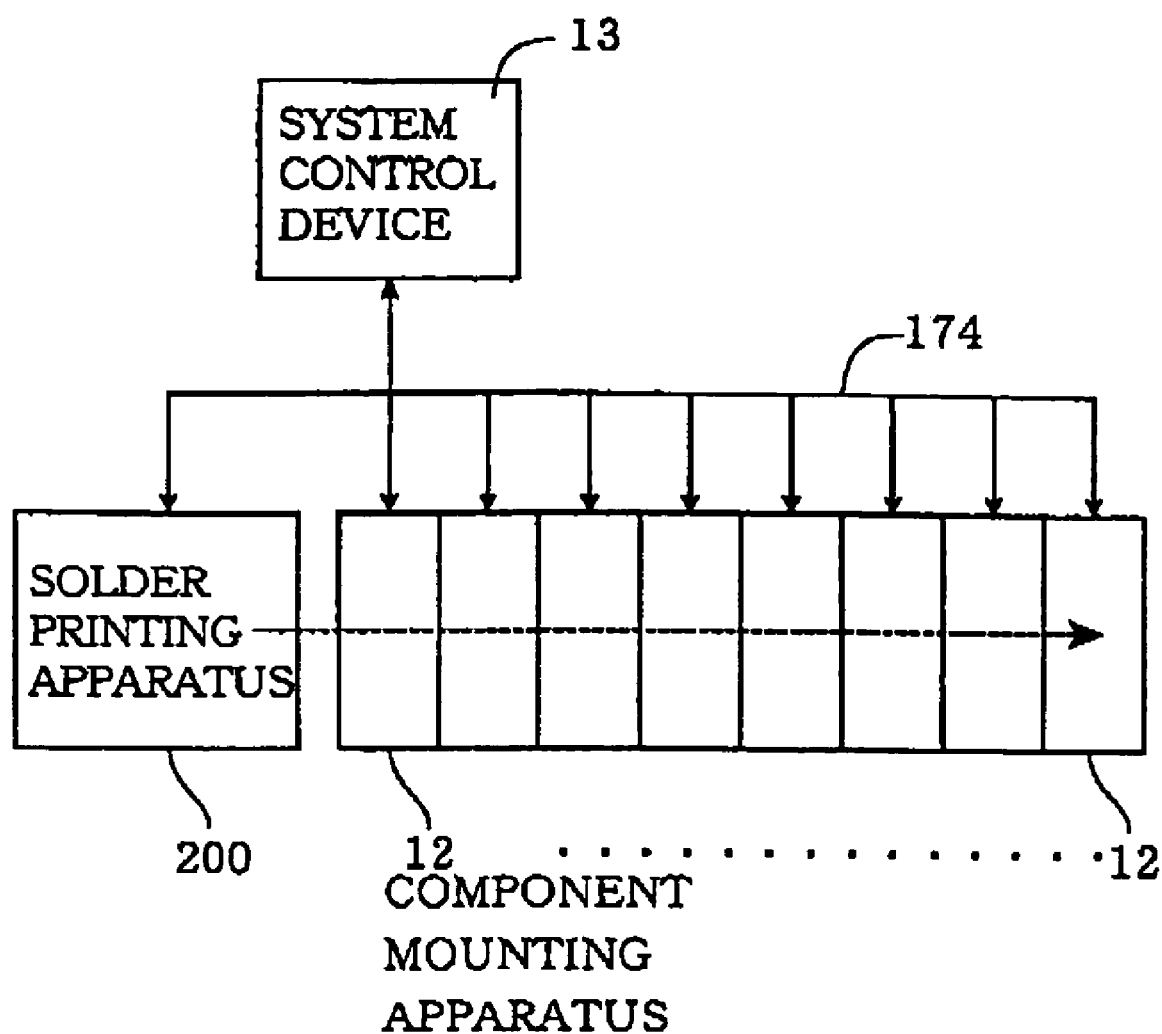
FIG. 10 is an illustrative view of a substrate-related-operation performing system including a solder printing apparatus and a plurality of component mounting apparatuses.

The above-described judging program is applicable to a substrate-related-operation performing system, as shown in FIG. 10, that includes a solder printing apparatus 200 and a plurality of component mounting apparatuses 12. In the present system, after the solder printing apparatus 200 applies solder cream to circuit substrates 86, the component mounting apparatuses 12 sequentially perform respective mounting operations on each of the circuit substrates 86.

As described above, the solder printing apparatus 200 is such an operation performing apparatus that prints solder cream to portions of each circuit substrate 86 where circuit components are to be mounted, before the circuit components are actually mounted. The solder printing apparatus 200 is constituted by, e.g., a circuit-substrate conveyor as a feeding device that feeds each circuit substrate 86; a circuit-substrate supporting, elevating, and lowering device that supports, elevates, and lowers the circuit substrate 86 fed by the circuit-substrate conveyor; a circuit-substrate holding-down device that holds down the circuit substrate 86 supported by the circuit-substrate supporting, elevating, and lowering device; a mask positioning and supporting device that positions and supports a mask plate holding a mask; a printing device that prints solder cream on the circuit substrate 86 through the mask; a mask cleaning device that cleans the mask held by the mask plate; a substrate-mark-image taking device that takes respective images of fiducial marks and a two-dimensional code 188 that are affixed to the circuit substrate 86; and a mask-mark-image taking device that takes respective images of fiducial marks affixed to the mask.

The solder printing apparatus 200 includes a control device similar to the mounting-apparatus control device 26 of each of the above-described component mounting apparatuses 12. The former control device includes a computer, and the computer controls the various devices of the solder printing apparatus 200 while implementing an operation performing program. Different sorts of circuit substrates 86 need different solder printing operations, respectively. Therefore, like each component mounting apparatus 12, the solder printing apparatus 200 needs different operation performing programs corresponding to the different sorts of circuit substrates 86, respectively. That is, the solder printing apparatus 200 is an operation performing apparatus that performs an operation according to an arbitrary one of the operation performing programs. In the following description of the present embodiment, it is assumed that a name of each operation performing program used with the solder printing apparatus 200 includes an operation-object code, like the name of each operation performing program used with each component mounting apparatus 12, and that the computer of the control device of the apparatus 200 stores, in a program storage portion thereof, an operation performing program and additionally stores an operation-object code corresponding to the stored operation performing program. The control device of the solder printing apparatus 200 is connected to the LAN 174, so that the control device can communicate information, i.e., various data with each of the component mounting apparatuses 12 and the system control device 13 via the LAN 174. Since the substrate-mark-image taking device of the solder printing apparatus 200 can take an image of the two-dimensional code 188 affixed to the circuit substrate 86 carried into the apparatus 200, and accordingly the apparatus 200 can obtain a substrate code representing a particular sort of the substrate 86, the apparatus 200 functions as an operation performing apparatus having operation-performed-substrate-related information. In addition, it is assumed that in the solder printing apparatus 200, the computer of the control device thereof implements the judging program and thereby judges whether an operation performing program selected for a judgment-object operation performing apparatus is appropriate.

Since the substrate-related-operation performing system including the solder printing apparatus 200 is constructed as described above, all the above-described judging modes in accordance with the judging program can be used to check the operation performing program selected for the judgment-object operation performing apparatus. To this end, "No. 1" is allotted as the number "No. X" of the solder printing apparatus 200, and "No. 2" through "No. 9" are allotted as the respective numbers "No. X" of the eight component mounting apparatuses 12. However, the judging program may be implemented by the computer of the system control device 13. More specifically described, the judging program may be implemented by an apparatus or device other than the judgment-object operation performing apparatus, if Step S13 of FIG. 7 is modified to X=X0+1, Step S32 of FIG. 8 is modified to X=X1−1, and Step S52 of FIG. 9 is modified to X=X1+1.

The invention claimed is:

1. A substrate-related-operation performing system, comprising:
 a plurality of substrate-related-operation performing apparatuses which are arranged along a line and which sequentially perform respective operations related to a circuit substrate, wherein the substrate-related-operation performing apparatuses comprise a judgment-object operation performing apparatus; and
 a program judging device which judges whether an operation performing program which is implemented by the judgment-object operation performing apparatus is appropriate, wherein the program judging device comprises
  a reference-information obtaining portion which obtains at least one batch of reference information which is related to at least one of the substrate-related-operation performing apparatuses and which is referred to in making a judgment about the operation performing program, and
  a judging portion which judges, based on the obtained batch of reference information, whether the operation performing program which is implemented by the judgment-object operation performing apparatus is appropriate,
 wherein the operation performing program comprises a next operation performing program corresponding to a next circuit substrate to which a next operation to be next performed by the judgment-object operation performing apparatus is related, wherein the judgment-object operation performing apparatus is to implement the next operation performing program and thereby perform the next operation related to the next circuit substrate, and wherein the judging portion judges whether the next operation performing program to be implemented by the judgment-object operation performing apparatus is appropriate,
 wherein the reference-information obtaining portion obtains said at least one batch of reference information comprising at least one batch of operation-performed-substrate-related information which is related to at least one circuit substrate to which at least one operation which is being performed by said at least one substrate-related-operation performing apparatus is related, and
 wherein the judging portion comprises a next-circuit-substrate recognizing portion which recognizes, based on said at least one batch of operation-performed-substrate-related information, said at least one circuit substrate as the next circuit substrate; and a next-circuit-substrate-dependent judging portion which judges whether the next operation performing program to be implemented by the judgment-object operation performing apparatus is appropriate for the next circuit substrate recognized by the next-circuit-substrate recognizing portion.

2. The substrate-related-operation performing system according to claim 1, wherein the next-circuit-substrate recognizing portion recognizes the next circuit substrate, based on said at least one batch of operation-performed-substrate-related information corresponding to at least one of the substrate-related-operation performing apparatuses that is located on an upstream side of the judgment-object operation performing apparatus.

3. The substrate-related-operation performing system according to claim 1, wherein the next-circuit-substrate recognizing portion recognizes the next circuit substrate, based on said at least one batch of operation-performed-substrate-related information corresponding to the judgment-object operation performing apparatus.

4. The substrate-related-operation performing system according to claim 1,
 wherein said at least one circuit substrate to which said at least one operation which is being performed by said at least one substrate-related-operation performing apparatus is related has an information indicator which is affixed to said at least one circuit substrate and indicates information related to said at least one circuit substrate,
 wherein said at least one substrate-related-operation performing apparatus includes an operation-performed-substrate-related-information recognizing device which recognizes, from the information indicator of said at least one circuit substrate, said at least one batch of operation-performed-substrate-related information related to said at least one circuit substrate, and
 wherein the reference-information obtaining portion obtains said at least one batch of operation-performed-substrate-related information recognized by the operation-performed-substrate-related-information recognizing device.

5. The substrate-related-operation performing system according to claim 1, wherein at least one of the substrate-related-operation performing apparatuses comprises at least the judging portion of the program judging device.

6. The substrate-related-operation performing system according to claim 1, wherein the program judging device is separate from each of the substrate-related-operation performing apparatuses.

7. The substrate-related-operation performing system according to claim 1, wherein the judgment-object operation performing apparatus comprises a program storage portion in which the operation performing program is stored upon operation of an input device by an operator, and wherein the program judging device judges whether the stored operation performing program is appropriate.

8. The substrate-related-operation performing system according to claim 1, wherein the plurality of substrate-related-operation performing apparatuses sequentially perform respective operations related to a circuit substrate of each of a plurality of sorts,
 wherein the judgment-object operation performing apparatus performs each of a plurality of operations according to a corresponding one of a plurality of operation performing programs corresponding to the plurality of sorts, respectively,
 wherein the reference-information obtaining portion obtains, as said at least one batch of operation-performed-substrate-related information, at least one batch of operation-performed-substrate-sort-related information which is related to a sort of said at least one circuit substrate to which said at least one operation which is being performed by said at least one substrate-related-operation performing apparatus is related, and
 wherein the next-circuit-substrate recognizing portion recognizes, based on said at least one batch of operation-performed-substrate-sort-related information, the sort of said at least one circuit substrate as a sort of the next circuit substrate, and the next-circuit-substrate-dependent judging portion judges whether the next operation performing program to be implemented by the judgment-object operation performing apparatus to perform the next operation is appropriate for the sort of the next circuit substrate recognized by the next-circuit-substrate recognizing portion.

9. The substrate-related-operation performing system according to claim 8, wherein at least one of the substrate-related-operation performing apparatuses comprises at least one circuit-component mounting apparatus which mounts a plurality of circuit components on the circuit substrate of said each of the plurality of sorts, according to a corresponding one of a plurality of mounting programs as the plurality of operation performing programs, wherein each of the mounting programs includes (a) first data representing an order in which circuit components are mounted on each of a plurality of circuit substrates of a corresponding one of the sorts, and (b) second data representing respective positions where the circuit components are mounted on said each circuit substrate of said corresponding sort, and wherein at least one of (a) the first data and (b) the second data of each one of the mounting programs differs from a corresponding one of (a) the first data and (b) the second data of the other mounting program or programs.

10. A substrate-related-operation performing system, comprising:
   a plurality of substrate-related-operation performing apparatuses which are arranged along a line and which sequentially perform respective operations related to a circuit substrate of each of a plurality of sorts, wherein the substrate-related-operation performing apparatuses comprise a judgment-object operation performing apparatus which performs each of a plurality of operations according to a corresponding one of a plurality of operation performing programs corresponding to the plurality of sorts respectively; and
   a program judging device which judges whether said one operation performing program which is implemented by the judgment-object operation performing apparatus is appropriate, wherein the program judging device comprises
      a reference-information obtaining portion which obtains at least one batch of reference information which is related to at least one of the substrate-related-operation performing apparatuses and which is referred to in making a judgment about said one operation performing program, and
      a judging portion which judges, based on the obtained batch of reference information, whether said one operation performing program which is implemented by the judgment-object operation performing apparatus is appropriate,
   wherein the reference-information obtaining portion obtains a plurality of said batches of reference information comprising a plurality of batches of program-related information, respectively, which are related to respective operation performing programs which are implemented by the substrate-related-operation performing apparatuses, and
   wherein the judging portion comprises a program-related-information-dependent judging portion which judges, based on at least one of the batches of program-related information that corresponds to at least one of the substrate-related-operation performing apparatuses that differs from the judgment-object operation performing apparatus, whether said one operation performing program which is implemented by the judgment-object operation performing apparatus is appropriate.

11. The substrate-related-operation performing system according to claim 10, wherein the program-related-information-dependent judging portion judges, based on the batch of program-related information corresponding to one of the substrate-related-operation performing apparatuses that is located on an upstream side of, and adjacent to, the judgment-object operation performing apparatus, whether said one operation performing program which is implemented by the judgment-object operation performing apparatus is appropriate.

12. The substrate-related-operation performing system according to claim 10, wherein the program-related-information-dependent judging portion judges, based on the batch of program-related information corresponding to one of the substrate-related-operation performing apparatuses that is performing the operation related to a most downstream one of the circuit substrates located on an upstream side of the judgment-object operation performing apparatus, whether said one operation performing program which is implemented by the judgment-object operation performing apparatus is appropriate.

13. The substrate-related-operation performing system according to claim 10, wherein the plurality of substrate-related-operation performing apparatuses comprise at least two substrate-related-operation performing apparatuses which constitute a concurrent-change group in which the respective operation performing programs implemented by said at least two substrate-related-operation performing apparatuses are concurrently changed with respective new operation performing programs, and the judgment-object operation performing apparatus belongs to the concurrent-change group, and
   wherein the program-related-information-dependent judging portion judges, based on at least one of the batches of program-related information that corresponds to at least one of said at least two substrate-related-operation performing apparatuses of the concurrent-change group that differs from the judgment-object operation performing apparatus, whether said one operation performing program which is implemented by the judgment-object operation performing apparatus is appropriate.

14. The substrate-related-operation performing system according to claim 10, wherein at least one of the substrate-related-operation performing apparatuses comprises at least the judging portion of the program judging device.

15. The substrate-related-operation performing system according to claim 10, wherein the program judging device is separate from each of the substrate-related-operation performing apparatuses.

16. The substrate-related-operation performing system according to claim 10, wherein the judgment-object operation performing apparatus comprises a program storage portion in which said one operation performing program is stored upon operation of an input device by an operator, and wherein the program judging device judges whether the stored operation performing program is appropriate.

17. The substrate-related-operation performing system according to claim 10, wherein at least one of the substrate-related-operation performing apparatuses comprises at least one circuit-component mounting apparatus which mounts a plurality of circuit components on the circuit substrate of said each of the plurality of sorts, according to a corresponding one of a plurality of mounting programs as the plurality of operation performing programs, wherein each of the mounting programs includes (a) first data representing an order in which circuit components are mounted on each of a plurality of circuit substrates of a corresponding one of the sorts, and (b) second data representing respective positions where the circuit components are mounted on said each circuit substrate of said corresponding sort, and wherein at least one of (a) the first data and (b) the second data of each one of the mounting programs differs from a corresponding one of (a) the first data and (b) the second data of the other mounting program or programs.

18. A judging program which is stored on a computer-readable medium and which is implemented by a computer to judge, in a substrate-related-operation performing system comprising a plurality of substrate-related-operation performing apparatuses which are arranged along a line and which sequentially perform respective operations related to a circuit substrate, whether an operation performing program which is implemented by a judgment-object operation performing apparatus as one of the substrate-related-operation performing apparatuses is appropriate, the judging program comprising:
a reference-information obtaining step of obtaining at least one batch of reference information which is related to at least one of the substrate-related-operation performing apparatuses and which is referred to in making a judgment about the operation performing program, and
a judging step of judging, based on the obtained batch of reference information, whether the operation performing program which is implemented by the judgment-object operation performing apparatus is appropriate,
wherein the reference-information obtaining step comprises an operation-performed-substrate-related information obtaining step of obtaining, as said at least one batch of reference information, at least one batch of operation-performed-substrate-related information which is related to at least one circuit substrate to which at least one operation which is being performed by said at least one substrate-related-operation performing apparatus is related, and
wherein the judging step is for judging whether a next operation performing program corresponding to a next circuit substrate to which a next operation to be next performed by said at least one judgment-object operation performing apparatus is related is appropriate, and comprises a next-circuit-substrate recognizing step of recognizing, based on said at least one batch of operation-performed-substrate-related information, said at least one circuit substrate as the next circuit substrate; and a next-circuit-substrate-dependent judging step of judging whether the next operation performing program to be implemented by the judgment-object operation performing apparatus is appropriate for the next circuit substrate recognized by the next-circuit-substrate recognizing portion.

19. The judging program according to claim 18, wherein the plurality of substrate-related-operation performing apparatuses sequentially perform respective operations related to a circuit substrate of each of a plurality of sorts,
wherein the judgment-object operation performing apparatus performs each of a plurality of operations according to a corresponding one of a plurality of operation performing programs corresponding to the plurality of sorts, respectively,
wherein the operation-performed-substrate-related information obtaining step comprises obtaining, as said at least one batch of operation-performed-substrate-related information, at least one batch of operation-performed-substrate-sort-related information which is related to a sort of said at least one circuit substrate to which said at least one operation which is being performed by said at least one substrate-related-operation performing apparatus is related, and
wherein the next-circuit-substrate recognizing step comprises recognizing, based on said at least one batch of operation-performed-substrate-sort-related information, the sort of said at least one circuit substrate as a sort of the next circuit substrate, and the next-circuit-substrate-dependent judging step comprises judging whether the next operation performing program to be implemented by the judgment-object operation performing apparatus to perform the next operation is appropriate for the recognized sort of the next circuit substrate.

20. A judging program which is stored on a computer-readable medium and which is implemented by a computer to judge, in a substrate-related-operation performing system comprising a plurality of substrate-related-operation performing apparatuses which are arranged along a line, which sequentially perform respective operations related to a circuit substrate of each of a plurality of sorts, and which comprise a judgment-object performing apparatus which performs each of a plurality of operations according to a corresponding one of a plurality of operation performing programs, respectively, whether said one operation performing program which is implemented by the judgment-object operation performing apparatus is appropriate, the judging program comprising:
a reference-information obtaining step of obtaining at least one batch of reference information which is related to at least one of the substrate-related-operation performing apparatuses and which is referred to in making a judgment about said one operation performing program, and
a judging step of judging, based on the obtained batch of reference information, whether said one operation performing program which is implemented by the judgment-object operation performing apparatus is appropriate,
wherein the reference-information obtaining step comprises a program-related-information obtaining step of obtaining, as a plurality of said batches of reference information, a plurality of batches of program-related information which are related to respective operation performing programs which are implemented by the substrate-related-operation performing apparatuses, and
wherein the judging step comprises a program-related-information-dependent judging step of judging, based on at least one of the batches of program-related information that corresponds to at least one of the substrate-related-operation performing apparatuses that differs from the judgment-object operation performing apparatus, whether the operation performing program which is implemented by the judgment-object operation performing apparatus is appropriate.

* * * * *